US012707946B2

(12) United States Patent
Choi et al.

(10) Patent No.: US 12,707,946 B2
(45) Date of Patent: Aug. 11, 2026

(54) INTEGRATED CIRCUIT DEVICES INCLUDING METAL STRUCTURES HAVING A CURVED INTERFACE AND METHODS OF FORMING THE SAME

(71) Applicant: Samsung Electronics Co., Ltd., Suwon-si (KR)

(72) Inventors: Jaemyung Choi, Niskayuna, NY (US); Janggeun Lee, Delmar, NY (US); Wonhyuk Hong, Clifton Park, NY (US); Kang-Ill Seo, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 840 days.

(21) Appl. No.: 17/929,833

(22) Filed: Sep. 6, 2022

(65) Prior Publication Data

US 2023/0369111 A1 Nov. 16, 2023

Related U.S. Application Data

(60) Provisional application No. 63/341,588, filed on May 13, 2022.

(51) Int. Cl.

| | |
|---|---|
| ***H10W 20/00*** | (2026.01) |
| ***H10W 20/41*** | (2026.01) |
| ***H10W 20/42*** | (2026.01) |
| ***H10W 20/44*** | (2026.01) |
| ***H10W 20/45*** | (2026.01) |

(52) U.S. Cl.

CPC ....... *H10W 20/077* (2026.01); *H10W 20/032* (2026.01); *H10W 20/063* (2026.01); *H10W 20/0633* (2026.01); *H10W 20/42* (2026.01); *H10W 20/425* (2026.01); *H10W 20/435* (2026.01); *H10W 20/4435* (2026.01);

(Continued)

(58) Field of Classification Search

CPC ......... H01L 21/76885; H01L 21/76834; H01L 23/5283; H10W 20/077; H10W 20/032; H10W 20/435

See application file for complete search history.

(56) References Cited

U.S. PATENT DOCUMENTS 8,772,938 B2 * 7/2014 Boyanov ............. H01L 23/5329 257/E21.582
9,780,025 B2 * 10/2017 Zheng ............... H01L 21/76834

(Continued)

*Primary Examiner* — Daniel Luke

(74) *Attorney, Agent, or Firm* — Myers Bigel, P.A.

(57) ABSTRACT

Integrated circuit devices and methods of forming the same are provided. The methods may include providing an underlying structure including a first insulating layer and forming a first metal structure, a first adhesion pattern, and a second insulating layer thereon. The second insulating layer may be on a side surface of the first metal structure, the first metal structure may include a metal pattern and a second adhesion pattern between the first insulating layer and the metal pattern, and the first adhesion pattern contacts side surfaces of the metal pattern and the second adhesion pattern. The methods may also include forming a second metal structure on the first metal structure. The metal pattern may include a contact portion protruding upwardly beyond an upper surface of the second insulating layer or may include an upper surface recessed with respect to the upper surface of the second insulating layer.

16 Claims, 24 Drawing Sheets

(52) U.S. Cl.
CPC ..... *H10W 20/4446* (2026.01); *H10W 20/455* (2026.01); *H10W 20/083* (2026.01)

(56) References Cited

U.S. PATENT DOCUMENTS

| | | | | |
|---|---|---|---|---|
| 10,580,696 | B1 | 3/2020 | Lin et al. | |
| 10,734,309 | B2 | 8/2020 | Kim et al. | |
| 10,804,199 | B2 * | 10/2020 | Shi | H01L 21/76802 |
| 10,867,905 | B2 | 12/2020 | Wang et al. | |
| 11,011,413 | B2 | 5/2021 | Wang et al. | |
| 2019/0181088 | A1 * | 6/2019 | Lee | H01L 21/76837 |
| 2021/0083119 | A1 | 3/2021 | Khaderbad et al. | |
| 2021/0351039 | A1 | 11/2021 | Huang et al. | |
| 2021/0366765 | A1 | 11/2021 | Lu et al. | |
| 2022/0045003 | A1 * | 2/2022 | Bae | H01L 21/76829 |
| 2022/0223526 | A1 * | 7/2022 | Min | H01L 23/535 |
| 2022/0238433 | A1 * | 7/2022 | Shin | H01L 23/5226 |
| 2023/0102662 | A1 * | 3/2023 | Li | H01L 21/76885 257/763 |

* cited by examiner 100-2
34
32'
24
26
14
36'
25'
27-1
37
16
27-2
16

36'
25'
27C
27-1
T'
W'
WL
16
24U
X
Z
Y 24
26
14
27-1
16
27-2
27S
16
27-1
27S
16
24U

INTEGRATED CIRCUIT DEVICES INCLUDING METAL STRUCTURES HAVING A CURVED INTERFACE AND METHODS OF FORMING THE SAME

CROSS-REFERENCE TO RELATED APPLICATION

This application claims priority to U.S. Provisional Application Ser. No. 63/341,588 entitled METAL STRUCTURES AND METHODS OF FORMING THE SAME, filed in the USPTO on May 13, 2022, the disclosure of which is hereby incorporated by reference herein in its entirety.

BACKGROUND

The present disclosure generally relates to the field of electronics and, more particularly, to integrated circuit devices.

An integrated circuit device with high integration density may include a narrow metal structure (e.g., a metal wire and/or a metal via) in a back end of line (BEOL) structure. Various methods and configurations have been suggested to reduce a contact resistance of a narrow metal structure and to reduce the likelihood of defects occurring while forming the narrow metal structure.

SUMMARY

According to some embodiments, methods of forming an integrated circuit device may include providing an underlying structure including a substrate and a first insulating layer and forming a first metal structure, a first adhesion pattern, and a second insulating layer on the first insulating layer. The second insulating layer may be on a side surface of the first metal structure, the first metal structure may include a metal pattern and a second adhesion pattern that is between the first insulating layer and the metal pattern, and the first adhesion pattern contacts both a side surface of the metal pattern and a side surface of the second adhesion pattern. The methods may also include forming a second metal structure on the first metal structure and the second insulating layer. The metal pattern of the first metal structure may include a contact portion that protrudes upwardly beyond an upper surface of the second insulating layer and contacts the second metal structure, or the metal pattern of the first metal structure may include an upper surface recessed with respect to the upper surface of the second insulating layer.

According to some embodiments, methods of forming an integrated circuit device may include providing an underlying structure including a substrate and a first insulating layer and forming a first metal structure and a second insulating layer on the first insulating layer. The second insulating layer may be on a side surface of the first metal structure, the first metal structure may have a width decreasing as a distance from the first insulating layer increases, and the first metal structure may include a metal pattern and an adhesion pattern that is between the first insulating layer and the metal pattern. The methods may also include forming a second metal structure on the first metal structure. The metal pattern of the first metal structure may include a contact portion that protrudes upwardly beyond an upper surface of the second insulating layer and contacts the second metal structure, or the metal pattern of the first metal structure may include an upper surface recessed with respect to the upper surface of the second insulating layer.

According to some embodiments, an integrated circuit device may include an underlying structure including a substrate and a first insulating layer, a first metal structure, a first adhesion pattern, and a second insulating layer on the first insulating layer. The second insulating layer may be on a side surface of the first metal structure, the first metal structure may include a metal pattern and a second adhesion pattern that is between the first insulating layer and the metal pattern, and the first adhesion pattern contacts both a side surface of the metal pattern and a side surface of the second adhesion pattern. The integrated circuit device may also include a second metal structure. The first metal structure and the second insulating layer may be between the first insulating layer and the second metal structure. The metal pattern of the first metal structure may include a contact portion that protrudes upwardly beyond an upper surface of the second insulating layer and contacts the second metal structure, or the metal pattern of the first metal structure may include an upper surface recessed with respect to the upper surface of the second insulating layer.

DETAILED DESCRIPTION

A narrow metal structure of a BEOL structure may be difficult to form using a damascene process. When a damascene process is used to form a narrow metal structure, a metal layer should fill a narrow opening. That filling process, however, may not completely fill the narrow opening, and the narrow metal structure may include a cavity that may increase a resistance of the narrow metal structure. Further, a contact resistance between a narrow metal structure and another metal structure may be high due to a small interface area therebetween.

According to some embodiments, a narrow metal structure may be formed by a subtractive patterning process that does not include filling a narrow opening. Further, according to some embodiments, an upper surface of the narrow metal structure may be a curved surface that can increase an interface area.

Figure 1:
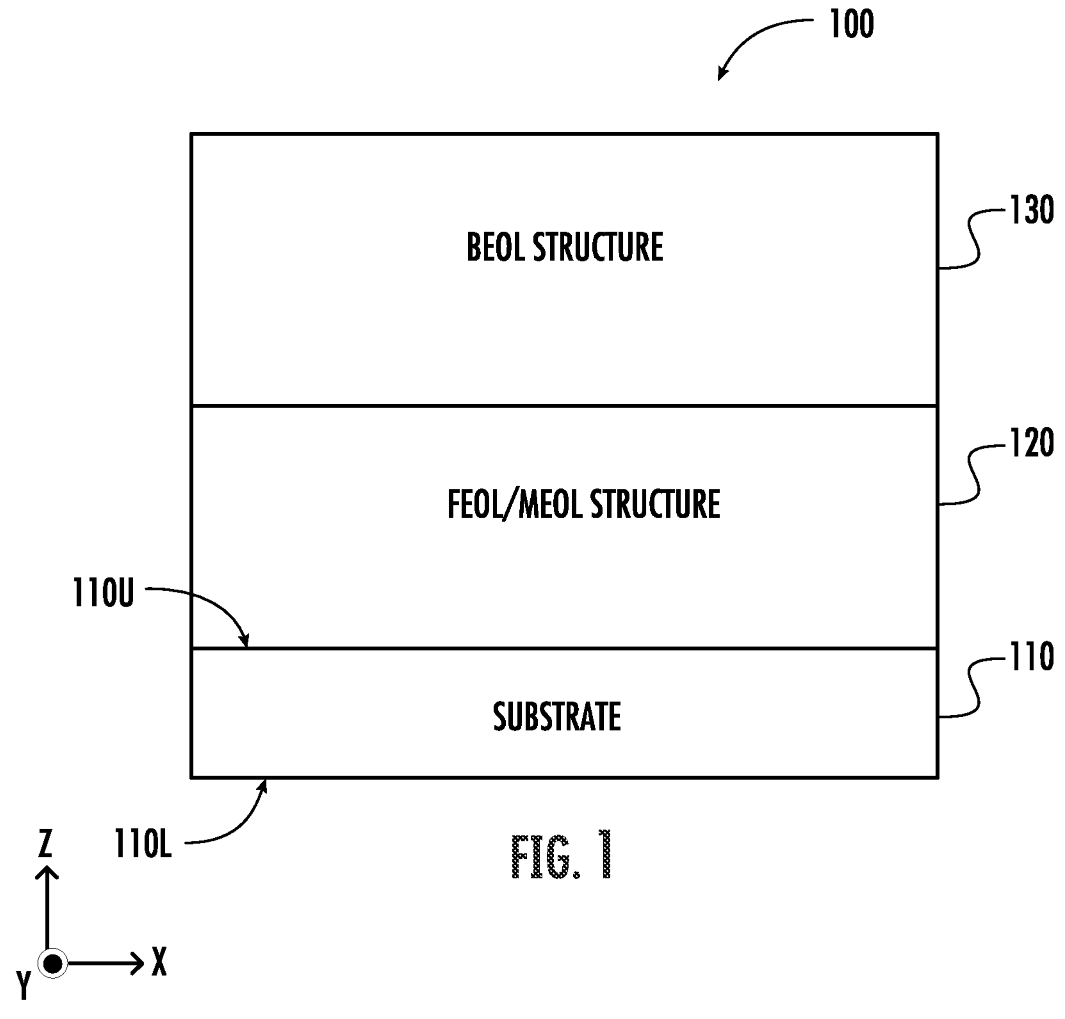
FIG. 1 is a diagram illustrating an integrated circuit device according to some embodiments.

FIG. 1 is a diagram illustrating an integrated circuit device 100 according to some embodiments. The integrated circuit device 100 may include a substrate 110, a front-end-of-line (FEOL)/middle-end-of-line (MEOL) structure 120 that includes elements formed during FEOL and MEOL processes, and a BEOL structure 130 that includes elements formed during a BEOL process. For example, the FEOL/MEOL structure 120 may include transistors and/or capacitors, and the BEOL structure 130 includes metal wires and/or metal vias.

The substrate 110 may include one or more semiconductor materials, for example, Si, Ge, SiGe, GaP, GaAs, SiC, SiGeC and/or InP. In some embodiments, the substrate 110 may be a bulk substrate (e.g., a bulk silicon substrate) or a semiconductor on insulator (SOI) substrate. For example, the substrate 110 may be a silicon wafer.

The substrate 110 may include an upper surface 110U facing the FEOL/MEOL structure 120 and a lower surface 110L opposite the upper surface 110U. The upper surface 110U and the lower surface 110L of the substrate 110 may be parallel to a first horizontal direction X and a second horizontal direction Y. In some embodiments, the first horizontal direction X and the second horizontal direction Y may be perpendicular to each other. The upper surface 110U and the lower surface 110L of the substrate 110 may be spaced apart from each other in a vertical direction Z. The vertical direction Z may be perpendicular to the first and second horizontal directions X and Y.

Figure 2:
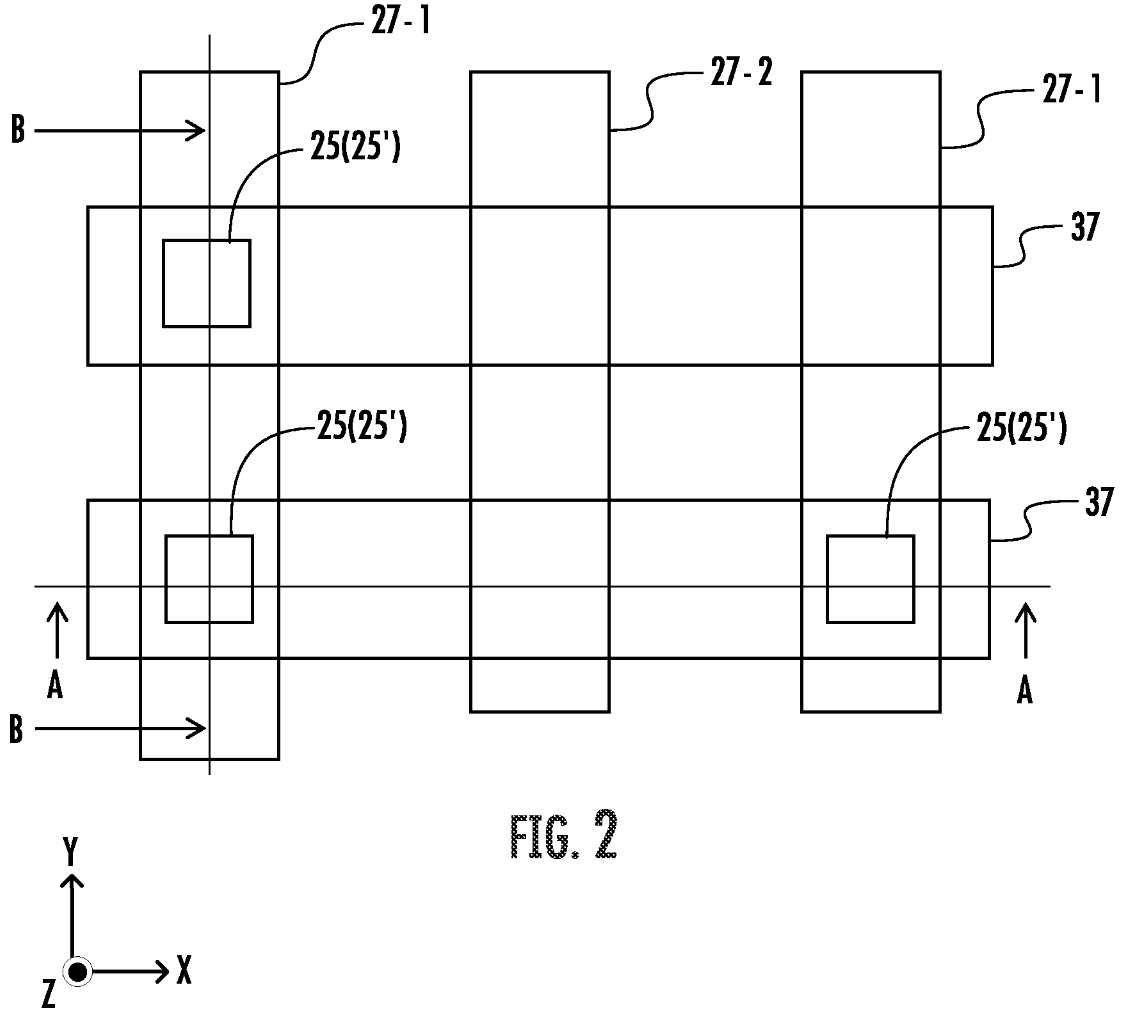
FIG. 2 is a layout of a BEOL structure according to some embodiments.
Figure 3A:
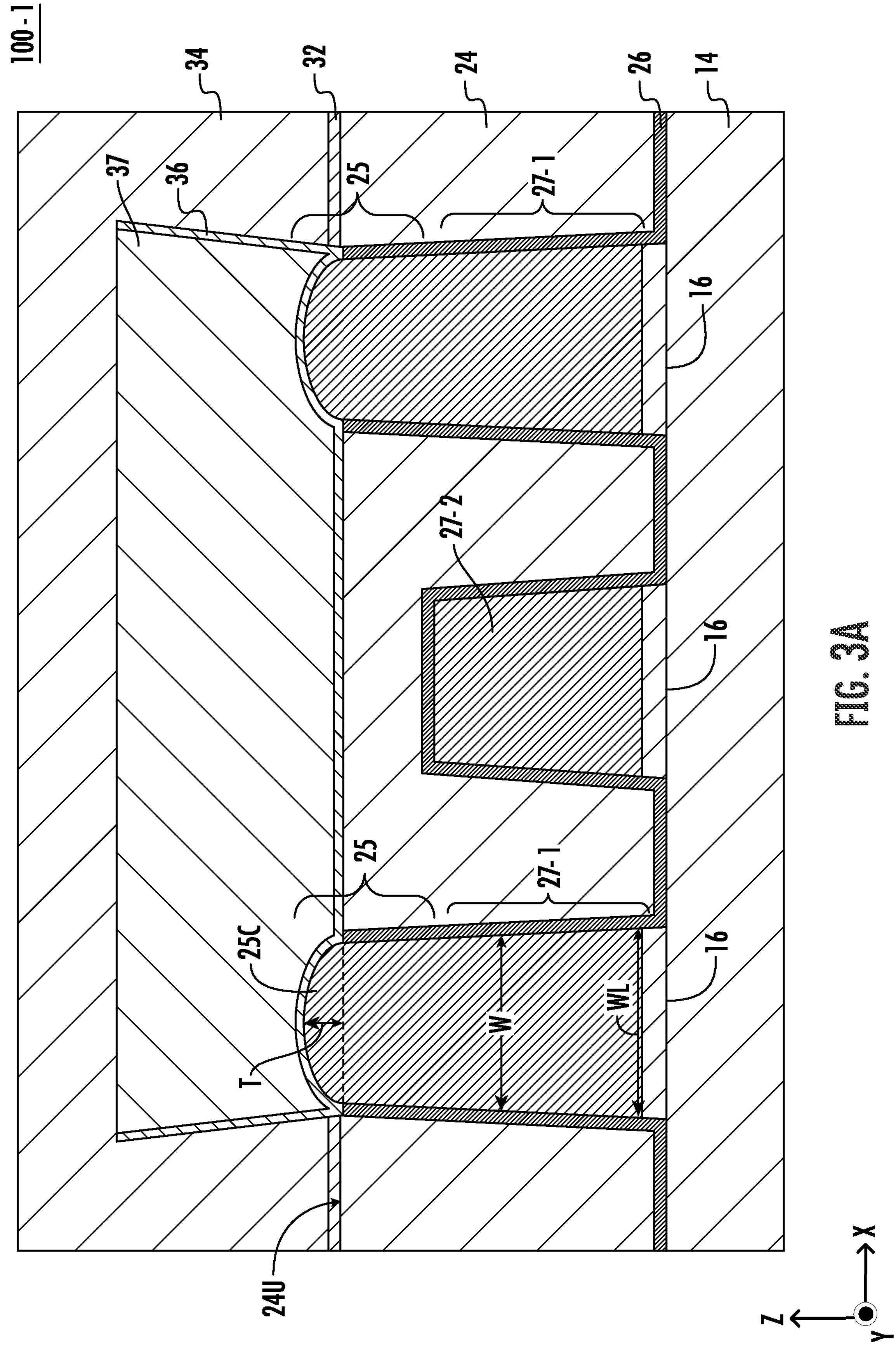
FIGS. 3A and 3B are cross-sectional views taken along a line A-A and a line B-B in FIG. 2, respectively, according to some embodiments.
Figure 3B:
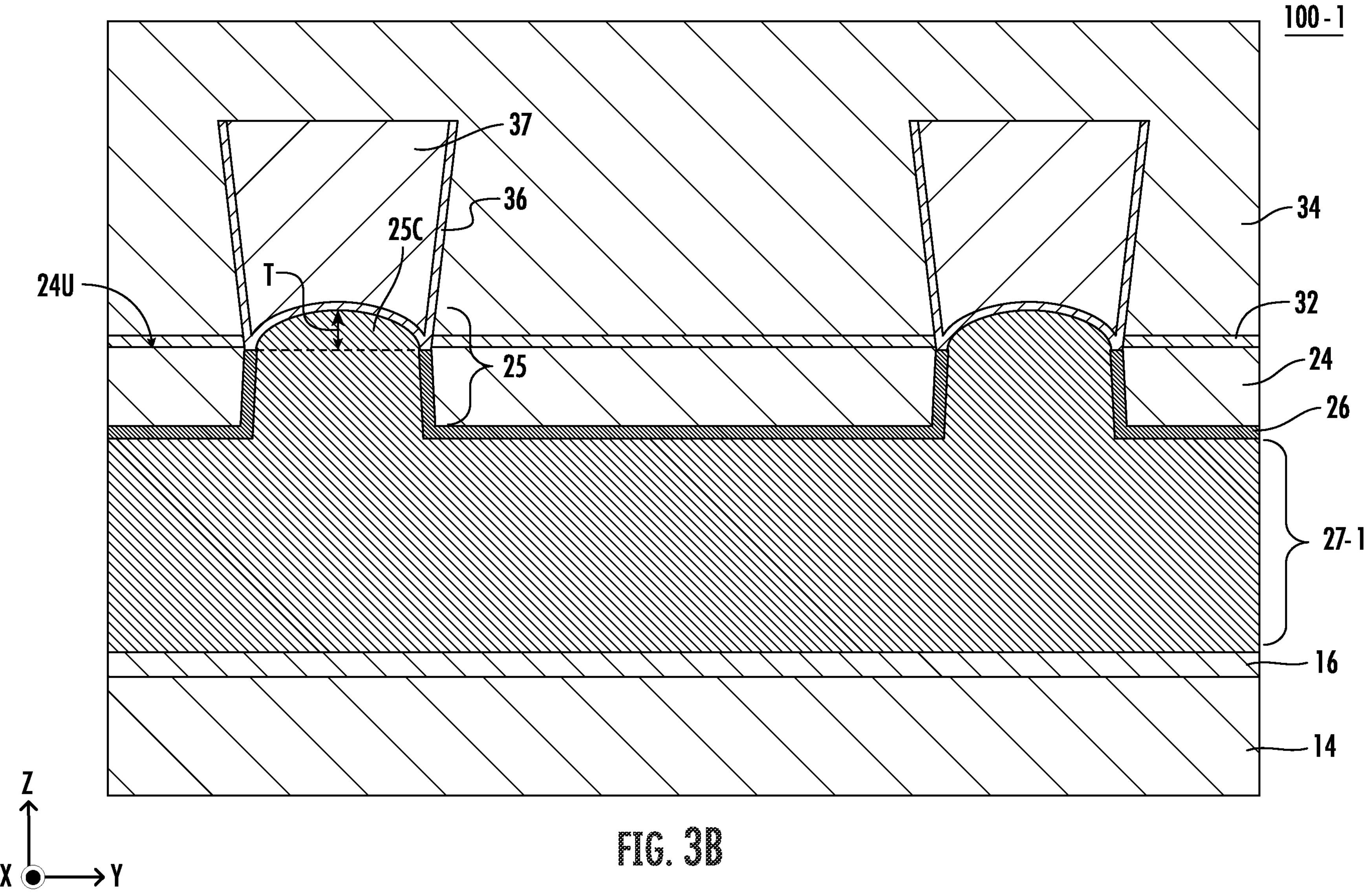

FIG. 2 is a layout of a BEOL structure according to some embodiments, and FIGS. 3A and 3B are cross-sectional views of a portion of a first integrated circuit device 100-1 taken along a line A-A and a line B-B in FIG. 2, respectively. FIGS. 3A and 3B show a BEOL structure and a portion of a MEOL structure of the first integrated circuit device 100-1.

Referring to FIGS. 2, 3A and 3B, the first integrated circuit device 100-1 may include an underlying structure including a substrate (e.g., the substrate 110 in FIG. 1) and a first insulating layer 14 of the MEOL structure and may also include the BEOL structure provided on the underlying structure.

The BEOL structure may include a second insulating layer 24 and a third insulating layer 34. The second insulating layer 24 may be provided between the first insulating layer 14 and the third insulating layer 34. An etch stop layer 32 may be provided between the second insulating layer 24 and the third insulating layer 34. The etch stop layer 32 may contact both the second insulating layer 24 and the third insulating layer 34. An upper metal structure including a liner 36 and an upper metal wire 37 may be provided in the etch stop layer 32 and the third insulating layer 34. The upper metal wire 37 may extend longitudinally in the first horizontal direction X. The upper metal structure may be a second metal structure.

First and second lower metal wires 27-1 and 27-2 may be provided in the second insulating layer 24. The first and second lower metal wires 27-1 and 27-2 may be spaced apart from each other in the first horizontal direction X and may each extend longitudinally in the second horizontal direction Y. A metal via 25 may be provided on the first lower metal wire 27-1, and the first lower metal wire 27-1 may be electrically connected to the upper metal wire 37 through the metal via 25 and the liner 36. A lower portion of the metal via 25 may be provided in the second insulating layer 24. A via may not be provided on the second lower metal wire 27-2. The metal via 25 and the first lower metal wire 27-1 contacting the metal via 25 may collectively be a metal pattern.

An upper portion of the metal via 25 may include a contact portion 25C that protrudes upwardly beyond an upper surface 24U of the second insulating layer 24 and contacts the upper metal structure (e.g., the liner 36 of the upper metal structure). The contact portion 25C of the metal via 25 may include a rounded upper surface curved toward the upper metal structure. In some embodiments, the rounded upper surface may have an arc shape as illustrated in FIG. 3A. The rounded upper surface of the contact portion 25C may increase an interface area between the upper metal structure and the metal via 25 compared with the case in which the metal via 25 has a planar upper surface, and a contact resistance between the metal via 25 and the upper metal structure may decrease due to the increased interface area.

The interface area between the upper metal structure and the metal via 25 may be proportional to a thickness T of the contact portion 25C in the vertical direction Z. The thickness T of the contact portion 25C may refer to a thickest thickness of the contact portion 25C. In some embodiments, the thickness T of the contact portion 25C may be a thickness of a center portion of the contact portion 25C in the first horizontal direction X. When an underlying structure includes a sharp corner, a layer subsequently formed thereon may not be formed on or around the sharp corner. The rounded upper surface of the contact portion 25C may allow a layer (e.g., the liner 36) to be conformally formed along the rounded upper surface and to have a uniform thickness on the rounded upper surface.

A first adhesion pattern 26 may be provided between the second insulating layer 24 and the first and second lower metal wires 27-1 and 27-2 and between the second insulating layer 24 and the first insulating layer 14. Second adhesion patterns 16 may be provided between the first insulating layer 14 and the first and second lower metal wires 27-1 and 27-2. Lower surfaces of the first and second lower metal wires 27-1 and 27-2 may contact the second adhesion patterns 16. As used herein, a lower surface of an element may refer to a surface facing a substrate (e.g., the substrate 110 in FIG. 1), and an upper surface of the element may be opposite the lower surface thereof.

The second adhesion pattern 16, the first lower metal wire 27-1 and the metal via 25 that contact each other may collectively be a first metal structure. The first metal structure (e.g., side surfaces of the first metal structure spaced apart from each other in the first horizontal direction X) may be formed by a subtractive patterning process by performing an etch process using a single etch mask (e.g., first mask patterns 27M in FIG. 7). Side surfaces of the second adhesion pattern 16, the first lower metal wire 27-1 and the metal via 25 may form a straight side surface as illustrated in FIG. 3A. The first metal structure may have a width W in the first horizontal direction X, which decreases as a distance from the substrate increases, as illustrated in FIG. 3A.

A portion of the first adhesion pattern 26 may continuously extend from the side surface of the metal via 25 onto the side surface of the second adhesion pattern 16. In some embodiments, that portion of the first adhesion pattern 26 may contact the side surfaces of the second adhesion pattern 16, the first lower metal wire 27-1 and the metal via 25, as illustrated in FIG. 3A. An upper surface of that portion of the first adhesion pattern 26 may be coplanar with an upper surface of the second insulating layer 24, as illustrated in FIG. 3A The lower surface of the first lower metal wire 27-1 may have a width WL in the first horizontal direction X. The thickness T of the contact portion 25C in the vertical direction Z may be from about 0.1 times to about 1.5 times the width WL of the lower surface of the first lower metal wire 27-1. For example, the thickness T of the contact portion 25C in the vertical direction Z may be from about 0.5 times to about 1 time the width WL of the lower surface of the first lower metal wire 27-1. When the thickness T of the contact portion 25C is thinner than 0.1 times the width WL of the lower surface of the first lower metal wire 27-1, the interface area between upper metal structure and the metal via 25 may not increase enough to provide a desired low contact resistance.

Each of the first, second and third insulating layers 14, 24 and 34 may include an insulating material (e.g., silicon oxide, silicon oxynitride, silicon nitride, and/or low-k material). For example, each of the first, second and third insulating layers 14, 24 and 34 may include a low k material. The low k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

The first and second adhesion patterns 26 and 16, the liner 36 and the etch stop layer 32 may include material(s) different from the first, second and third insulating layers 14, 24 and 34. The first adhesion pattern 26 may include an insulating layer (e.g., a SiN layer and/or a SiCN layer) and may have a thickness of from about 1 nanometer (nm) to about 10 nm (e.g., from about 1 nm to about 3 nm). The second adhesion pattern 16 may include a conductive layer (e.g., a TiN layer and/or a TaN) and may have a thickness of from about 1 nanometer (nm) to about 10 nm (e.g., from about 1 nm to about 3 nm). The liner 36 may include a diffusion barrier layer (e.g., a TaN layer and/or a TiN layer) and/or a conductive liner (e.g., a Co layer). The conductive liner of the liner 36 may extend between the diffusion barrier layer of the liner 36 and the upper metal wire 37 and may separate the diffusion barrier layer of the liner 36 from the upper metal wire 37. The etch stop layer 32 may include an insulating layer (e.g., a SiN layer, a SiCN layer and/or an AlN layer) and may have a thickness of from about 10 nm to about 100 nm (e.g., about 80 nm).

Each of the metal via 25 and the first and second lower metal wires 27-1 and 27-2 may include a metal layer (e.g., a ruthenium layer and/or a molybdenum layer). In some embodiments, the metal via 25 and the first lower metal wire 27-1 contacting each other may collectively be a monolithic layer (e.g., a ruthenium layer or a molybdenum layer), and the metal via 25 and the first lower metal wire 27-1 may be an upper portion and a lower portion of a monolithic metal layer, respectively. The upper metal wire 37 may include a metal layer (e.g., a copper layer, a tungsten layer, a cobalt layer and/or an aluminum layer). For example, the upper metal wire 37 may be a copper layer.

Figure 4A:
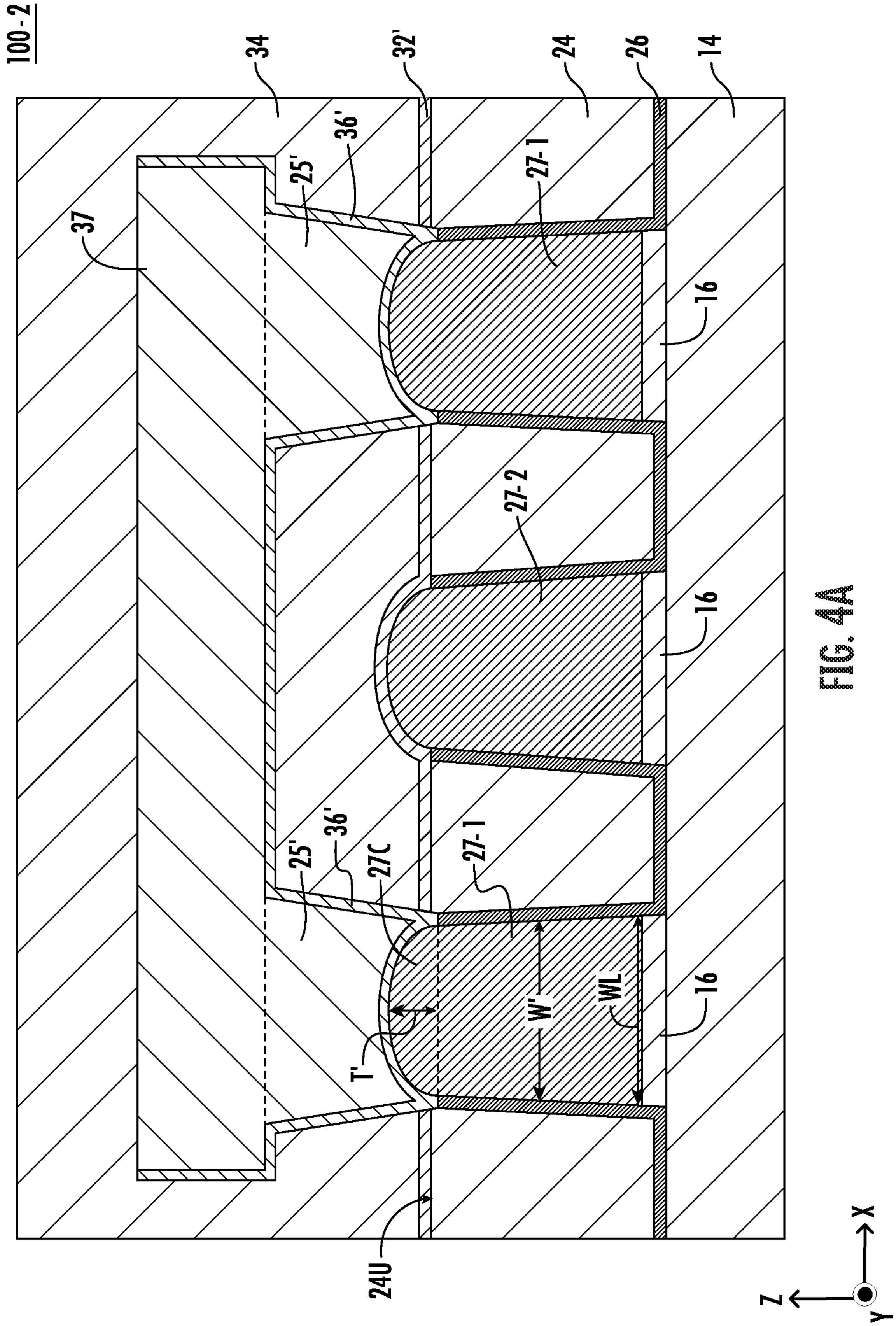
FIGS. 4A and 4B are cross-sectional views taken along a line A-A and a line B-B in FIG. 2, respectively, according to some embodiments.
Figure 4B:
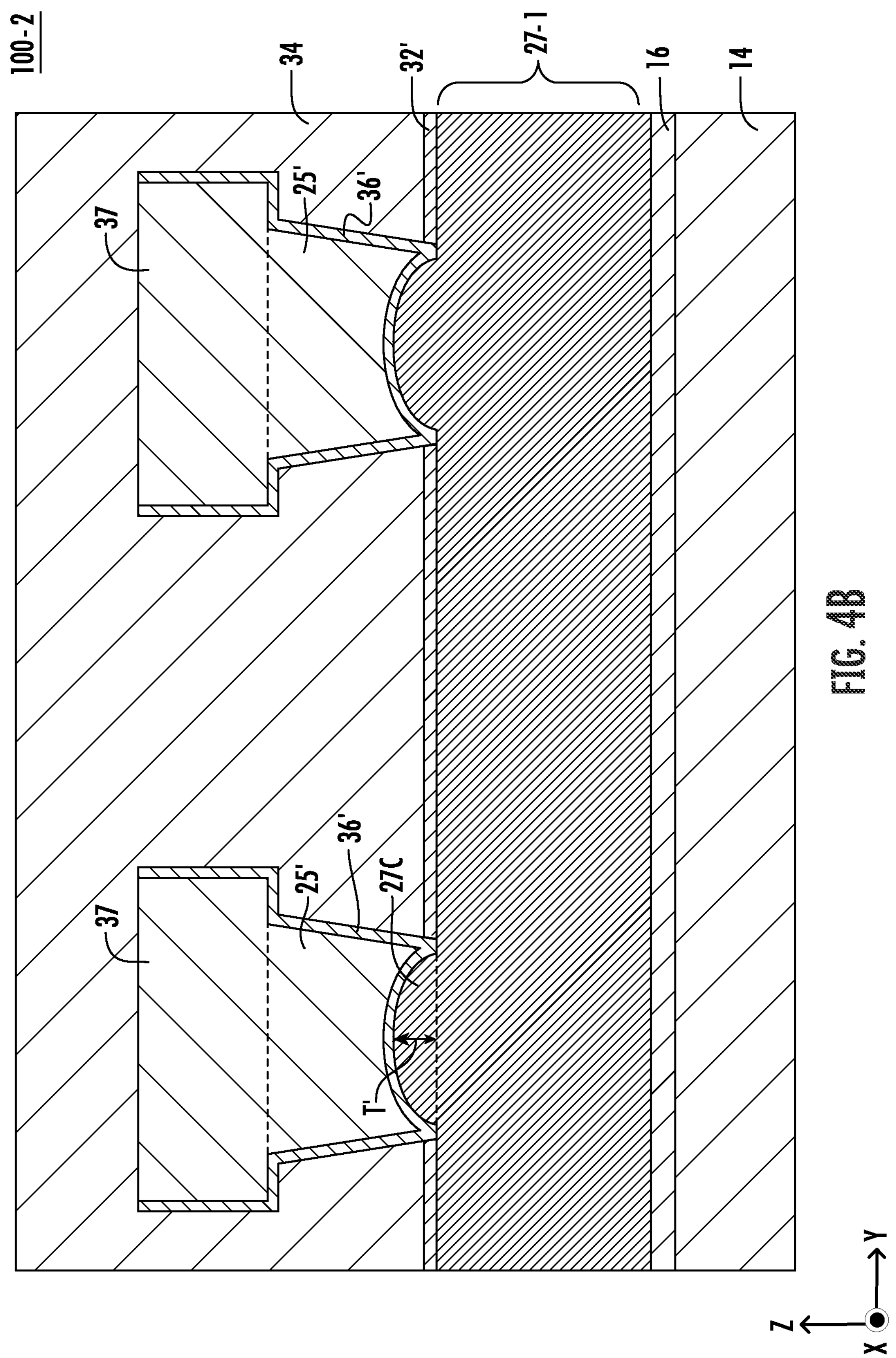

FIGS. 4A and 4B are cross-sectional views of a portion of a second integrated circuit device 100-2 taken along a line A-A and a line B-B in FIG. 2, respectively. FIGS. 4A and 4B also show a BEOL structure and a portion of a MEOL structure (e.g., the first insulating layer 14) of the second integrated circuit device 100-2. The first and second integrated circuit devices 100-1 and 100-2 include different examples of BEOL structures that can be provided along the lines A-A and B-B of FIG. 2.

Referring to FIGS. 2, 4A and 4B, the BEOL structure of the second integrated circuit device 100-2 is similar to the BEOL structure of the first integrated circuit device 100-1 with primary differences being that each of the first and second lower metal wires 27-1 and 27-2 may include a rounded upper surface, and a metal via 25' may be provided in the third insulating layer 34.

The second adhesion pattern 16 and the first lower metal wire 27-1, which contact each other, may collectively be a first metal structure. In some embodiments, the first metal structure may be formed by a subtractive patterning process by performing an etch process using a single etch mask (e.g., first mask patterns 27M in FIG. 13). Side surfaces of the second adhesion pattern 16 and the first lower metal wire 27-1 may form a straight side surface as illustrated in FIG. 4A. The first metal structure may have a width W' in the first horizontal direction X, which decreases as a distance from the substrate increases, as illustrated in FIG. 4A.

An upper portion of the first lower metal wire 27-1 may include a contact portion 27C that protrudes upwardly beyond an upper surface 24U of the second insulating layer 24 and contacts a metal via 25'. The contact portion 27C has a rounded upper surface curved toward the metal via 25'. The liner 36' may be provided between the metal via 25' and the first lower metal wire 27-1. The contact portion 27C may have a thickness T', in the vertical direction Z, in a range of from about 0.1 times to about 1.5 times (e.g., from about 0.5 times to about 1 time) the width WL of the lower surface of the first lower metal wire 27-1. The liner 36' may also be provided on a lower surface and side surfaces of the upper metal wire 37.

The metal via 25' and the upper metal wire 37 may collectively be referred to as a second metal structure. Each of the metal via 25' and the upper metal wire 37 may include a metal layer (e.g., a copper layer, a tungsten layer, a cobalt layer and/or an aluminum layer). In some embodiments, the metal via 25' and the upper metal wire 37 may collectively be a monolithic metal layer (e.g., a copper layer, a tungsten layer or an aluminum layer). For example, the metal via 25' and the upper metal wire 37 may collectively be a copper layer. When the metal via 25' and the upper metal wire 37 include the same material, a visible interface between the metal via 25' and the upper metal wire 37 may not be present. For simplicity of illustration, however, that interface is shown in FIGS. 4A and 4B with a dotted line.

Figure 5:
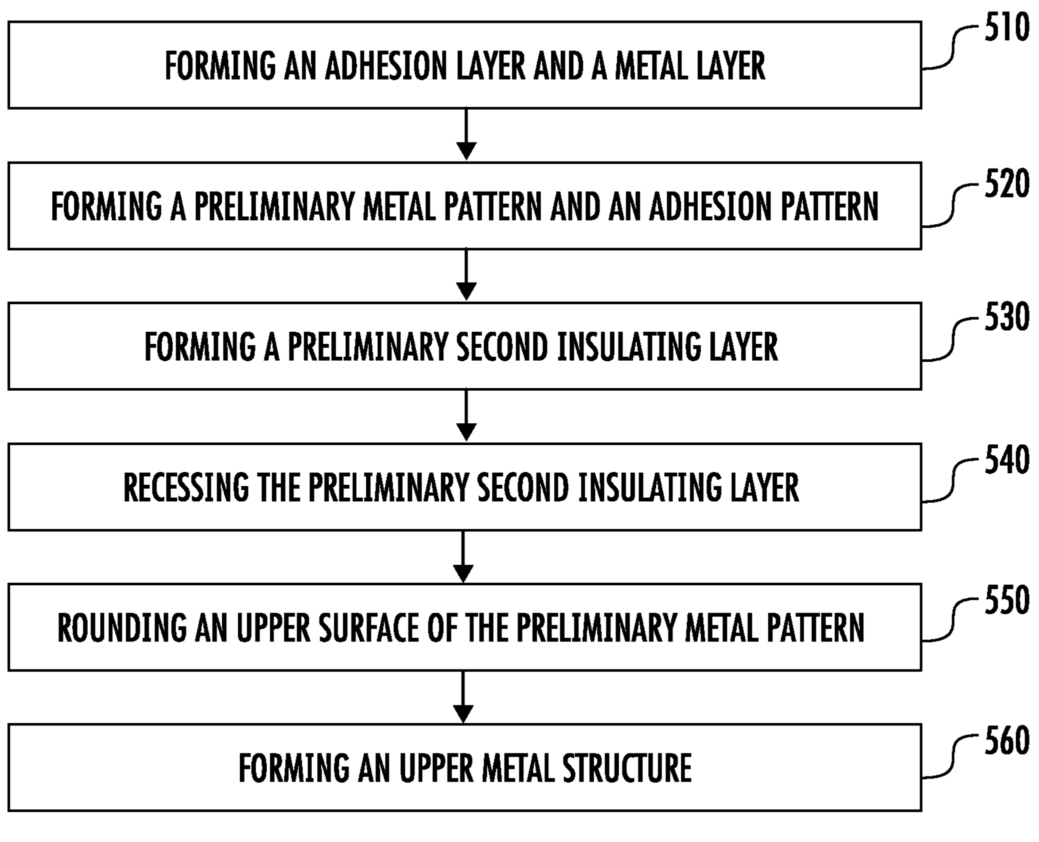
FIG. 5 is a flow chart of methods of forming an integrated circuit device according to some embodiments.

FIG. 5 is a flow chart of a method of forming an integrated circuit device according to some embodiments, and FIGS. 6 to 12 are cross-sectional views illustrating a method of forming the first integrated circuit device 100-1 illustrated in FIGS. 3A and 3B according to some embodiments. Specifically, FIGS. 6 to 12 are cross-sectional views taken along the line A-A of FIG. 2.

Figure 6:
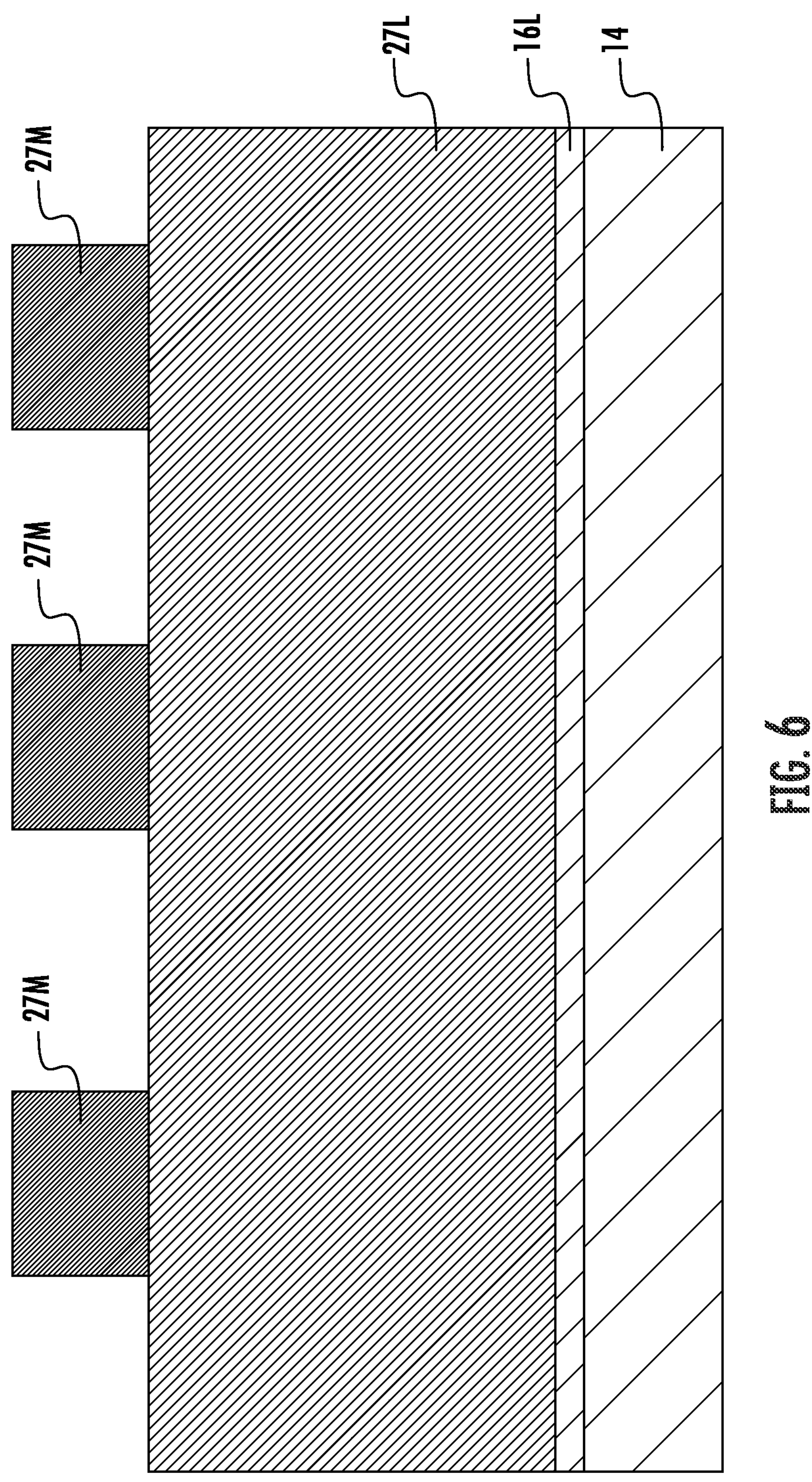
FIGS. 6 to 12 are cross-sectional views illustrating a method of forming an integrated circuit device according to some embodiments.

Referring to FIGS. 5 and 6, the method may include forming an adhesion layer 16L and a metal layer 27L (Block 510) on a first insulating layer 14 of a MEOL structure. The adhesion layer 16L may extend between the first insulating layer 14 and the metal layer 27L and may contact the first insulating layer 14. First mask patterns 27M may be formed on the metal layer 27L. The first mask patterns 27M may include, for example, a photoresist layer and/or a hard mask layer.

Figure 7:
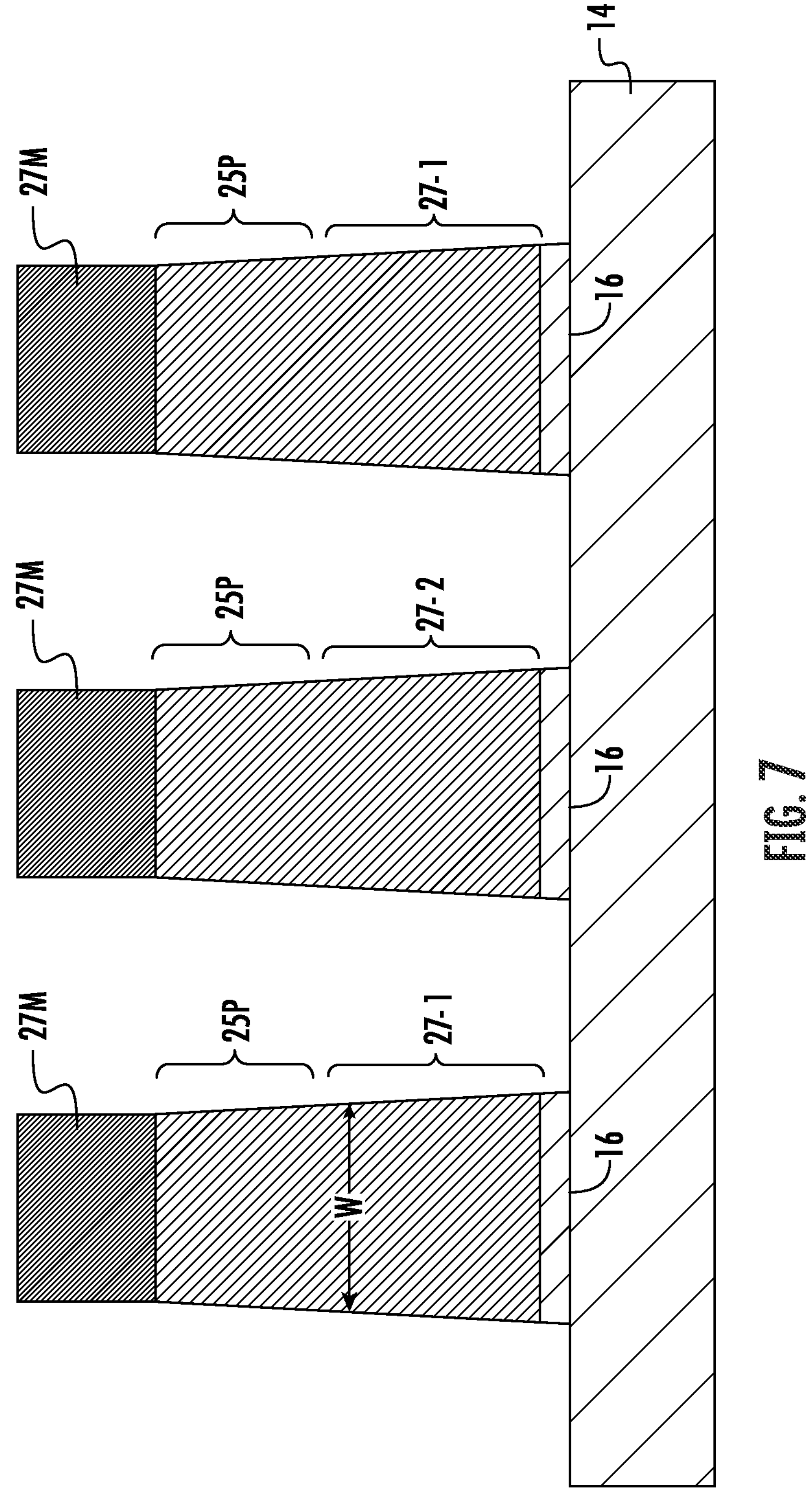

Referring to FIGS. 5 and 7, the method may include forming preliminary metal patterns and adhesion patterns 16

(Block 520) by etching the metal layer 27L and the adhesion layer 16L using the first mask patterns 27M as an etch mask. Each of the preliminary metal patterns may include a lower portion (e.g., a first lower metal wire 27-1 or a second lower metal wire 27-2) and an upper portion (e.g., a preliminary metal via 25P). The metal layer 27L and the adhesion layer 16L may be etched using the first mask patterns 27M as an etch mask. Accordingly, side surfaces of the preliminary metal pattern and the adhesion pattern 16 may form a straight side surface, and a width W of the preliminary metal pattern may decrease as a distance from the first insulating layer 14 increases. The first mask patterns 27M may be removed after the preliminary metal pattern and the adhesion patterns 16 are formed.

Figure 8:
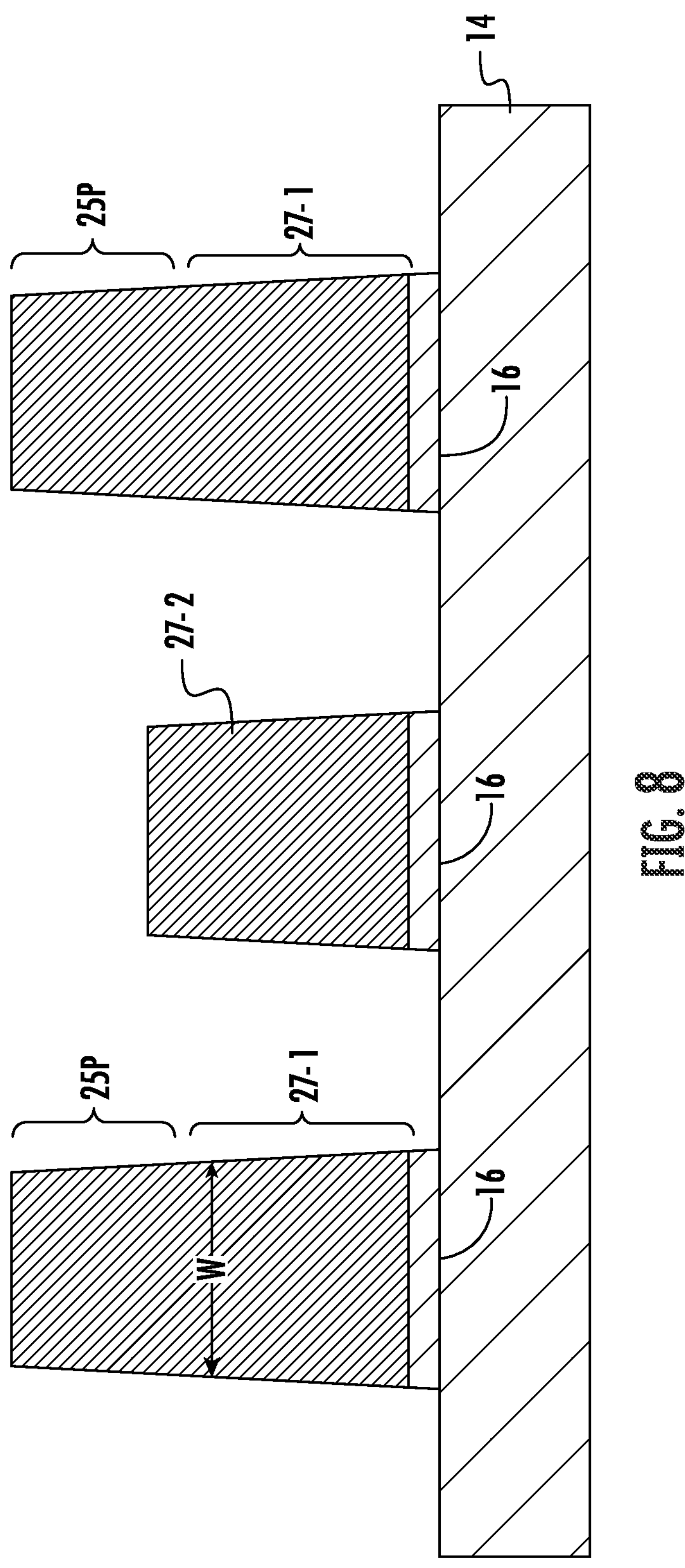

Referring to FIG. 8, the preliminary metal via 25P formed on the second lower metal wire 27-2 may be removed, thereby exposing an upper surface of the second lower metal wire 27-2. Although not shown in FIG. 8, a portion of the preliminary metal via 25P formed on the first lower metal wire 27-1 may also be removed, thereby exposing a portion of an upper surface of the first lower metal wire 27-1, which is not covered by the preliminary metal via 25P.

Figure 9:
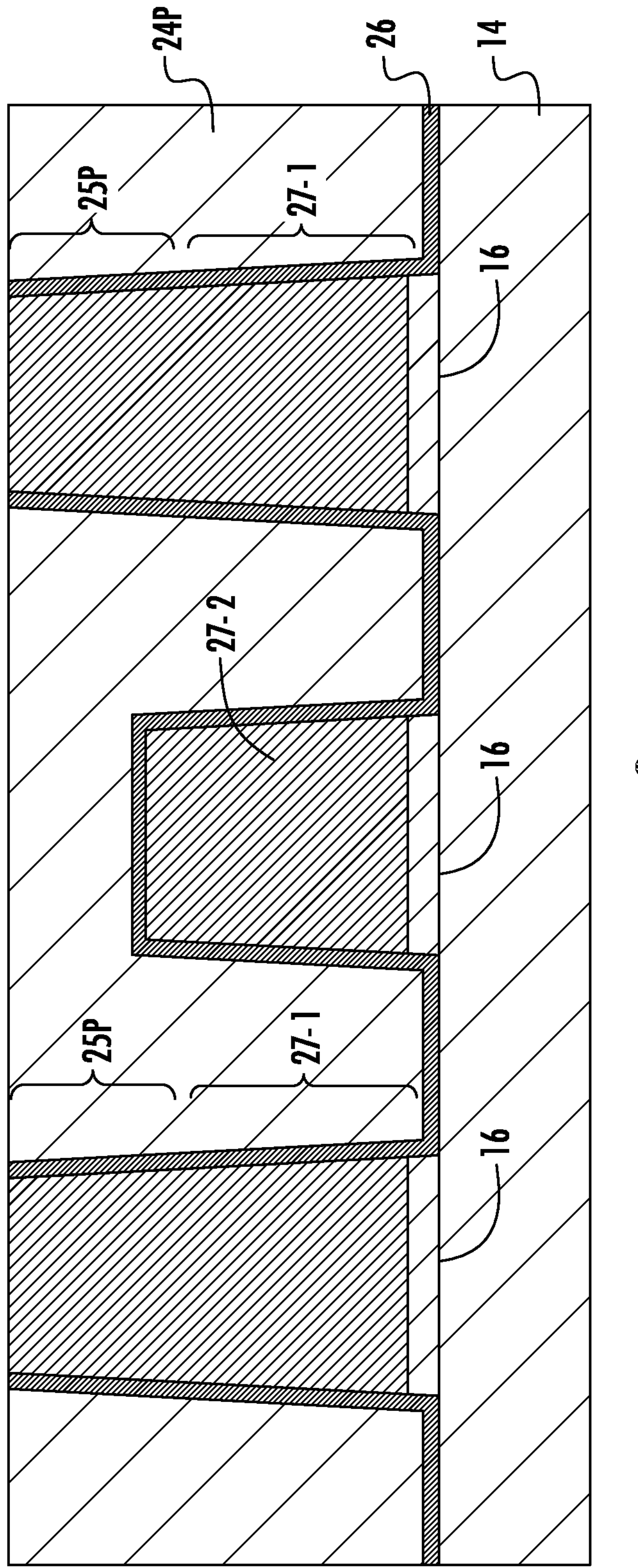

Referring to FIGS. 5 and 9, a preliminary second insulating layer 24P may be formed on the preliminary metal via 25P and the first and second lower metal wires 27-1 and 27-2 (Block 530). Before forming the preliminary second insulating layer 24P, an additional adhesion layer 26 (also referred to as a first adhesion layer) may be formed on side surfaces of the adhesion pattern 16, the first and second lower metal wires 27-1 and 27-2 and the preliminary metal via 25P. In some embodiments, a planarization process (e.g., a chemical mechanical polishing process) may be performed after the additional adhesion layer 26 and the preliminary second insulating layer 24P are formed until an upper surface of the preliminary metal via 25P is exposed.

Figure 10:
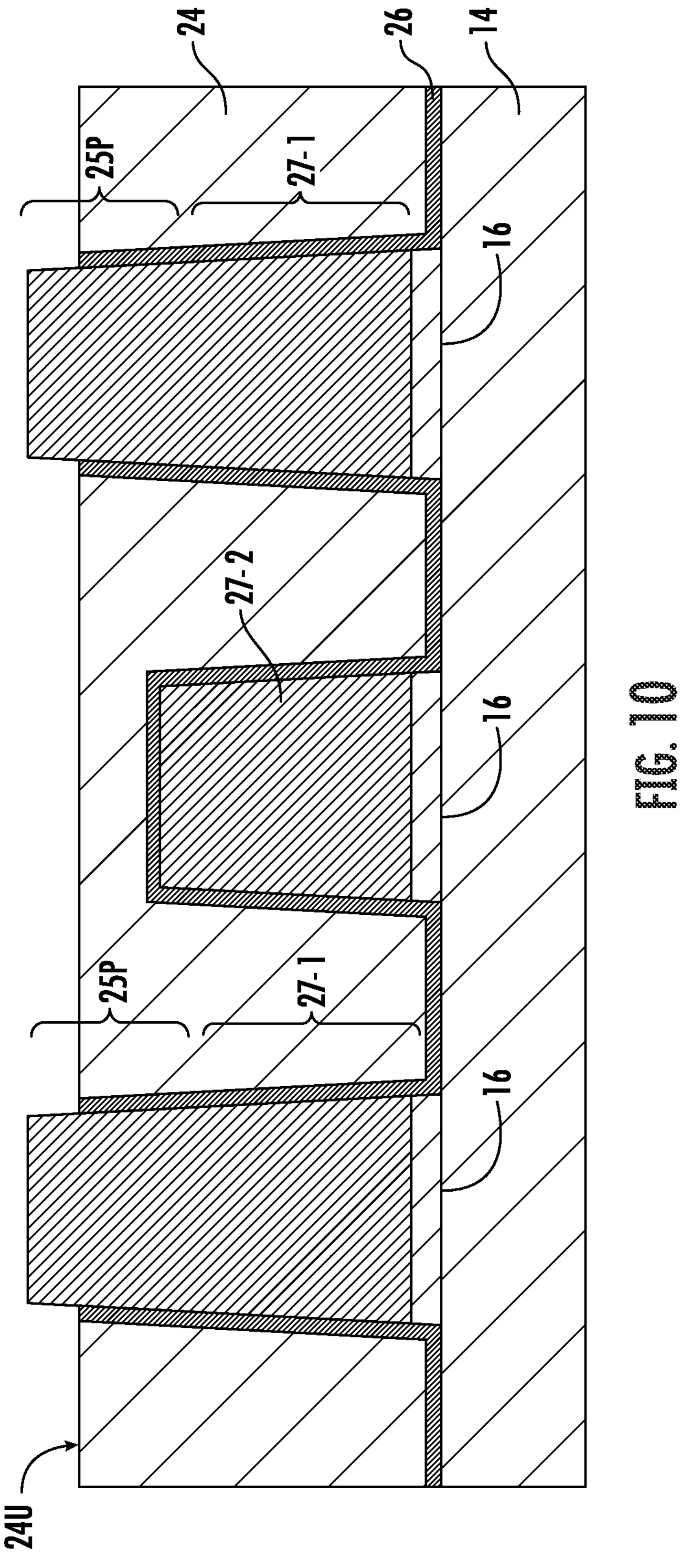

Referring to FIGS. 5 and 10, the method may include recessing the preliminary second insulating layer 24P (Block 540), thereby forming a second insulating layer 24. While recessing the preliminary second insulating layer 24P, the additional adhesion layer 26 may also be recessed such that an upper portion of the preliminary metal via 25P may protrude upwardly beyond an upper surface 24U of the second insulating layer 24 and an upper surface of the additional adhesion layer 26. The preliminary second insulating layer 24P and the additional adhesion layer 26 may be recessed using a process (e.g., a dry etch process and/or a wet etch process) that does not have selectivity between the preliminary second insulating layer 24P and the additional adhesion layer 26, and thus the upper surfaces of the second insulating layer 24 and the additional adhesion layer 26 may be coplanar with each other after recessing those layers, as illustrated in FIG. 10. For example, the preliminary second insulating layer 24P and the additional adhesion layer 26 may be recessed by a dry etch process using $CF_4$ and/or $CH_3F_4$ as an etchant.

Figure 11:
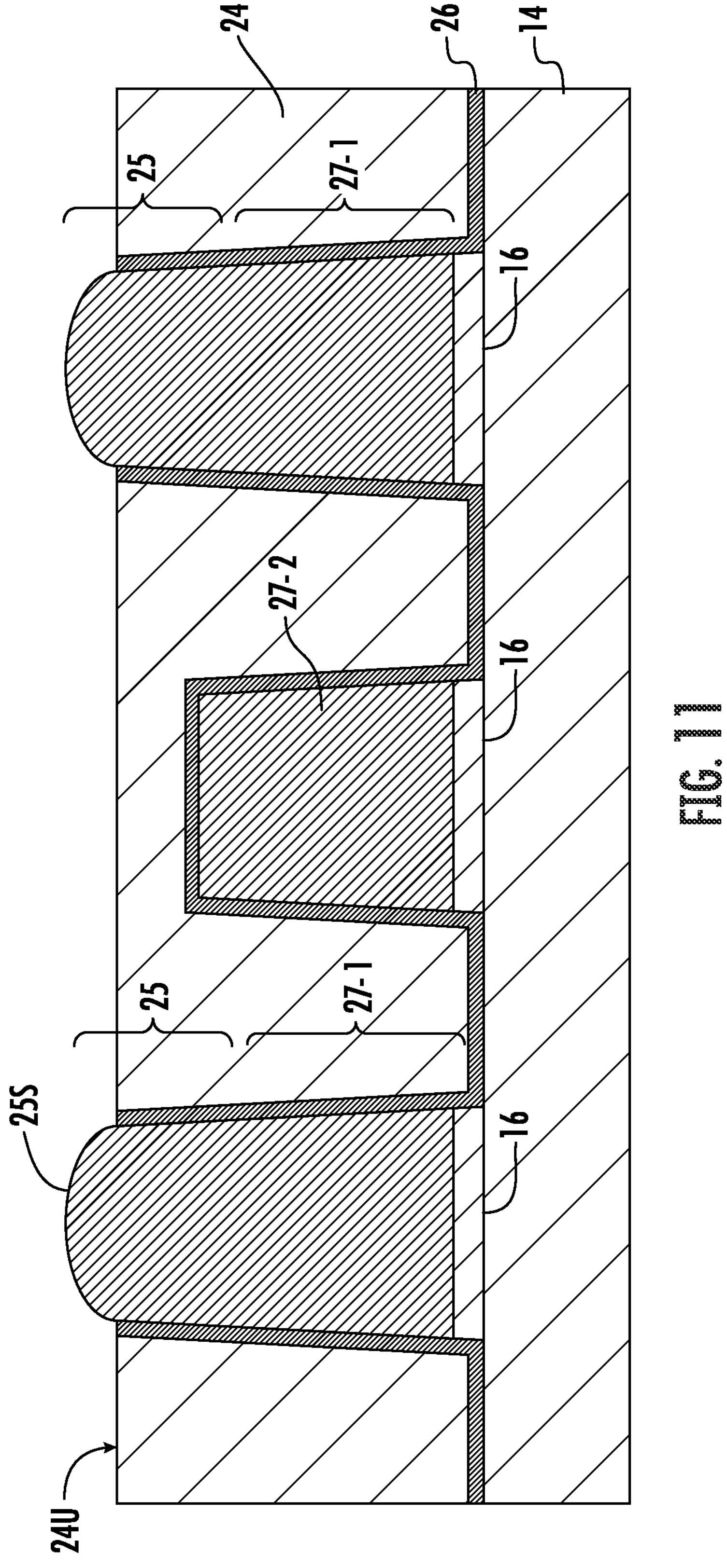

Referring to FIGS. 5 and 11, the upper portion of the preliminary metal via 25P may be rounded (Block 550) by etching, thereby forming a metal via 25 that has a rounded upper surface 25S. The upper surface 25S may have a convex shape. The upper portion of the preliminary metal via 25P may be etched by a dry etch process and/or a wet etch process, which selectively etch the upper portion of the preliminary metal via 25P while not etching the second insulating layer 24 and the additional adhesion layer 26.

Figure 12:
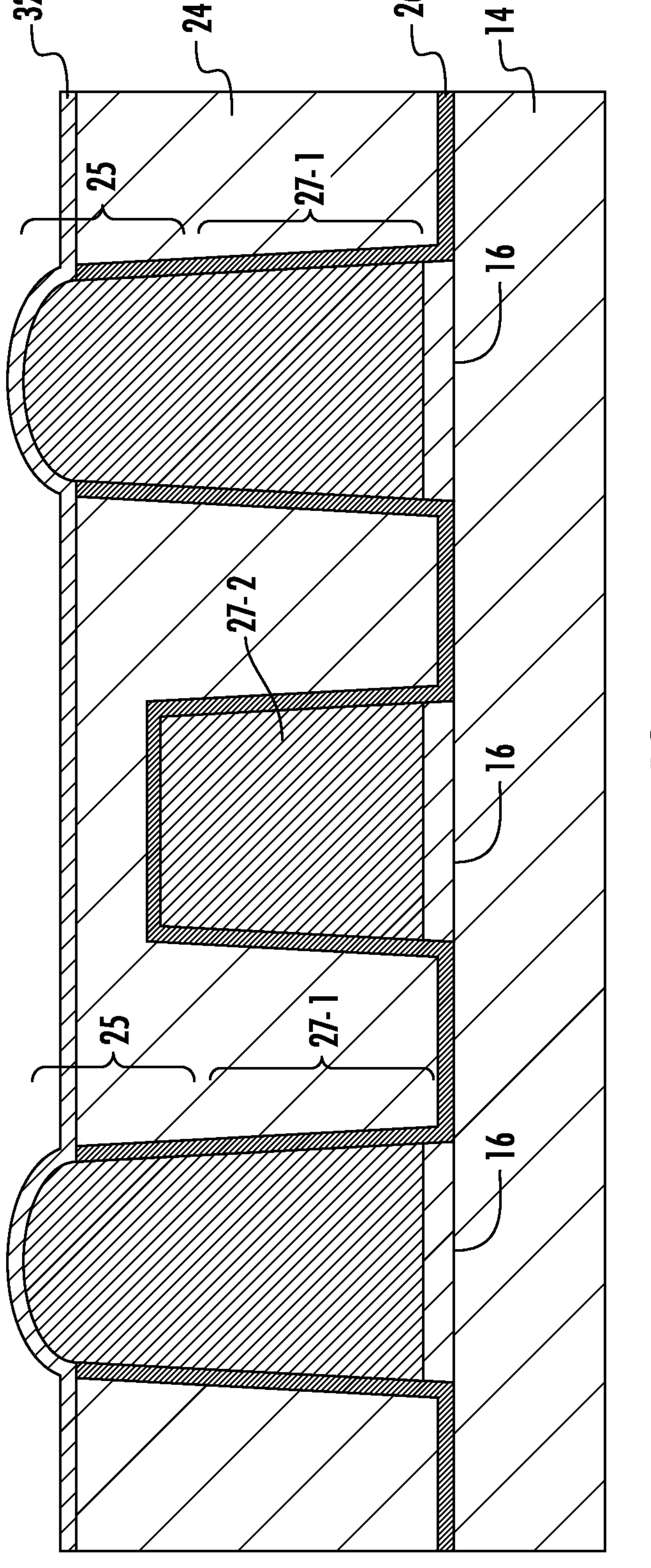

Referring to FIGS. 5 and 12, the method may include forming an upper metal structure (Block 560). An etch stop layer 32 may be formed on the metal via 25. Referring back to FIGS. 3A and 3B, the upper metal structure including a liner 36 and an upper metal wire 37 may be formed by a damascene process (e.g., forming a third insulating layer 34 including an opening on the etch stop layer 32, and sequentially forming the liner 36 and the upper metal wire 37 in the opening of the third insulating layer 34). The rounded upper surface of the metal via 25 may allow the etch stop layer 32 to be conformally deposited and to have a uniform thickness.

FIGS. 13 to 16 are cross-sectional views illustrating a method of forming the second integrated circuit device 100-2 illustrated in FIGS. 4A and 4B according to some embodiments. Specifically, FIGS. 13 to 16 are cross-sectional views taken along the line A-A of FIG. 2.

Figure 13:
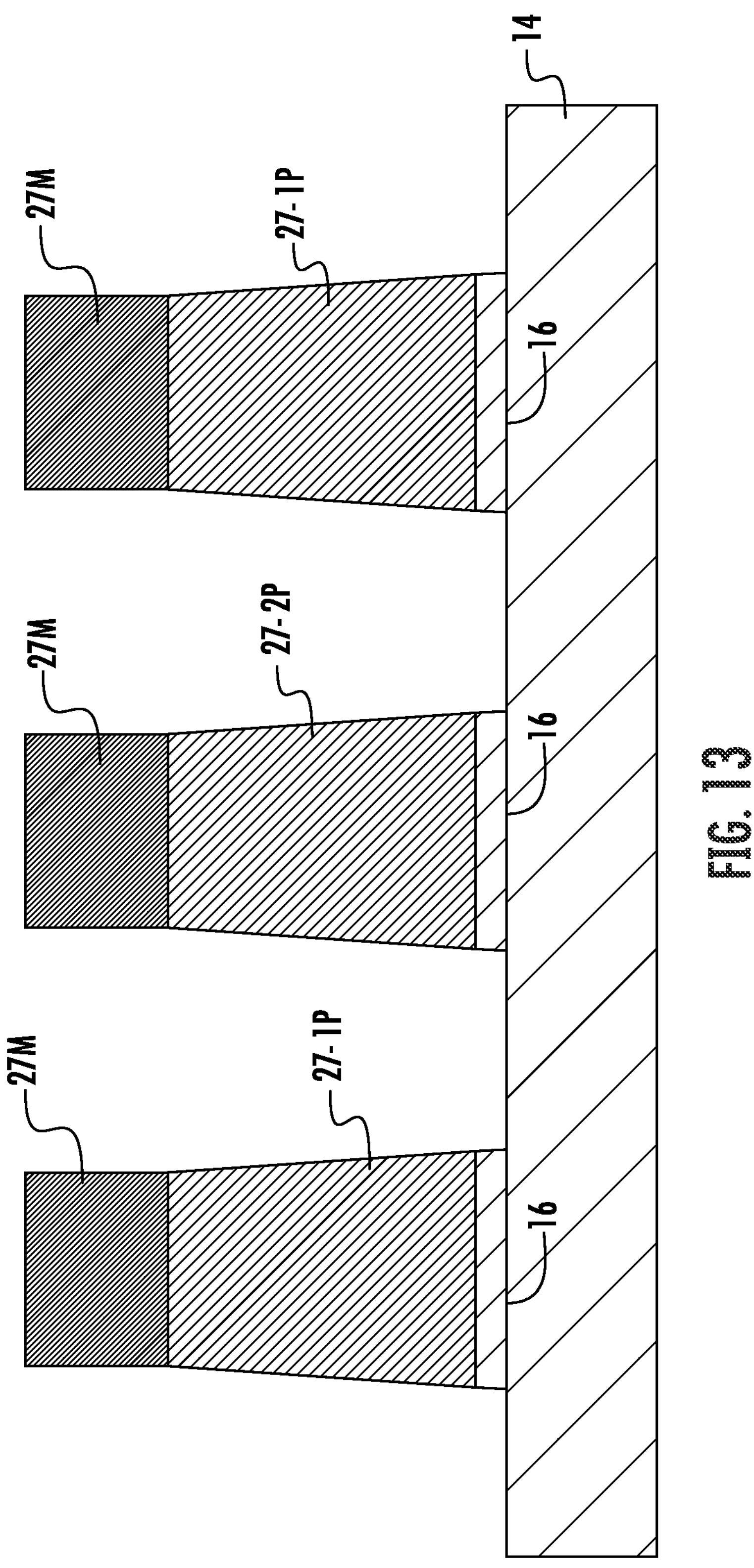
FIGS. 13 to 16 are cross-sectional views illustrating a method of forming an integrated circuit device according to some embodiments.

Referring to FIGS. 5 and 13, the method may include forming a preliminary metal pattern (e.g., a preliminary first lower metal wire 27-1P or a preliminary second lower metal wire 27-2P) and an adhesion pattern 16 (Block 520) by etching an adhesion layer (e.g., the adhesion layer 16L in FIG. 6) and a metal layer (e.g., the metal layer 27L in FIG. 6) using an etch mask (e.g., the first mask patterns 27M in FIG. 6). Side surfaces of the preliminary first lower metal wire 27-1P and the underlying adhesion pattern 16 may form a straight side surface. The first mask patterns 27M may be removed after the preliminary metal pattern and the adhesion pattern 16 are formed.

Figure 14:
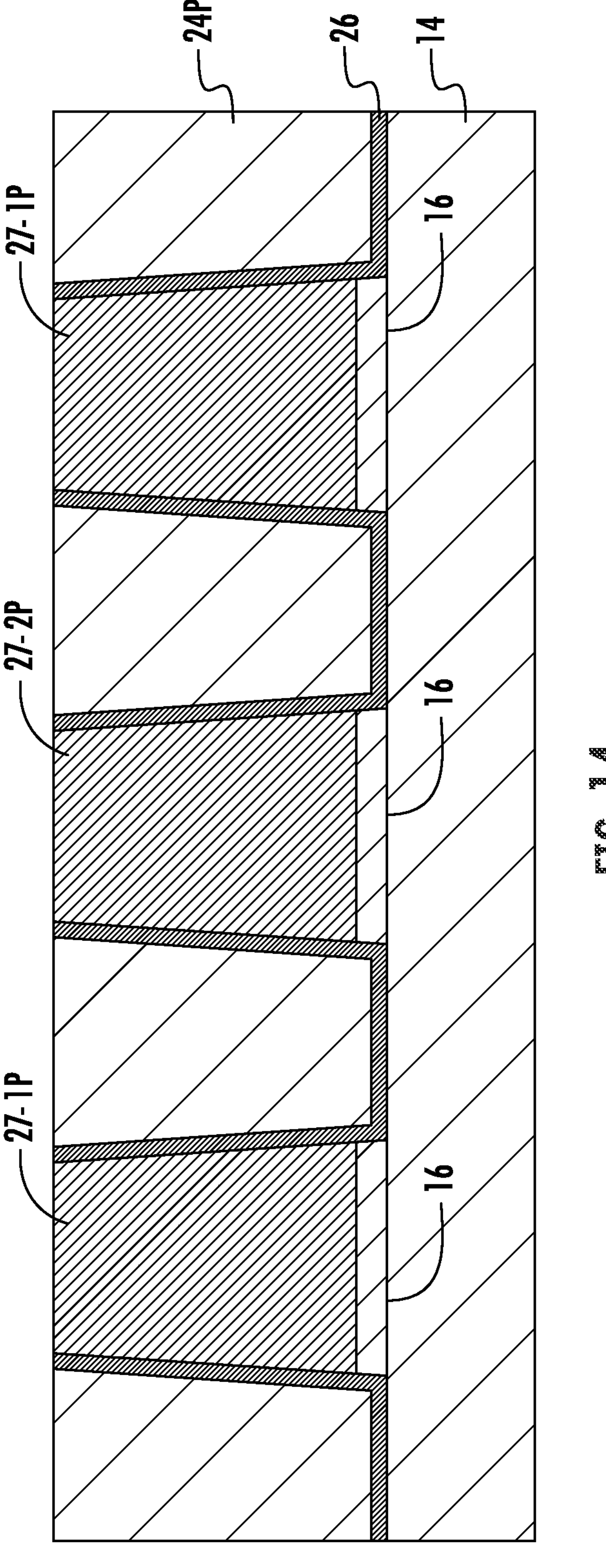

Referring to FIGS. 5 and 14, a preliminary second insulating layer 24P may be formed on the preliminary metal pattern and the adhesion pattern 16 (Block 530). Before forming the preliminary second insulating layer 24P, an additional adhesion layer 26 (also referred to as a first adhesion layer) may be formed on a side surface of the adhesion pattern 16 and on a side surface of the preliminary metal pattern. The additional adhesion layer 26 may contact the side surface of the adhesion pattern 16 and the side surface of the preliminary metal pattern. In some embodiments, a planarization process (e.g., a chemical mechanical polishing process and/or an etch process) may be performed after the additional adhesion layer 26 and the preliminary second insulating layer 24P are formed until upper surfaces of the preliminary metal patterns are exposed.

Figure 15:
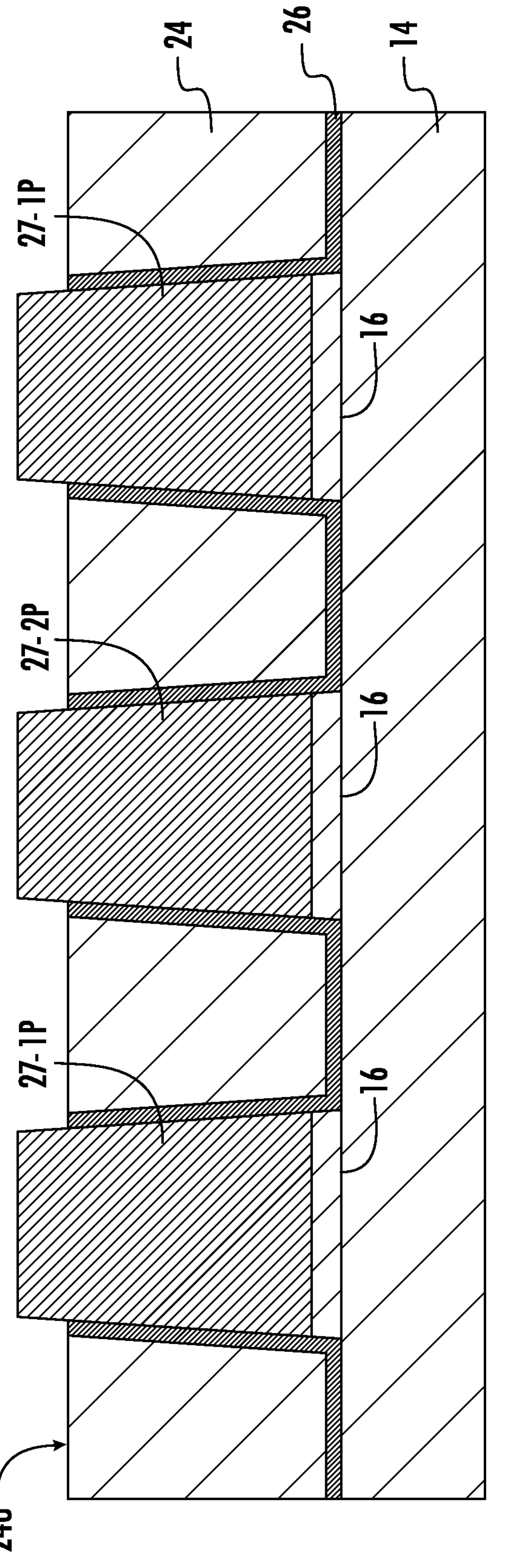

Referring to FIGS. 5 and 15, the method may include recessing the preliminary second insulating layer 24P (Block 540), thereby forming a second insulating layer 24. While recessing the preliminary second insulating layer 24P, the additional adhesion layer 26 may also be recessed such that upper portions of the preliminary first lower metal wire 27-1P and the preliminary second lower metal wire 27-2P may protrude upwardly beyond an upper surface 24U of the second insulating layer 24 and an upper surface of the additional adhesion layer 26. The preliminary second insulating layer 24P and the additional adhesion layer 26 may be recessed using a process (e.g., a dry etch process and/or a wet etch process) that does not have selectivity between the preliminary second insulating layer 24P and the additional adhesion layer 26, and thus the upper surfaces of the second insulating layer 24 and the additional adhesion layer 26 may be coplanar with each other as illustrated in FIG. 15 after recessing the preliminary second insulating layer 24P and the additional adhesion layer 26. For example, the preliminary second insulating layer 24P and the additional adhesion layer 26 may be recessed by a dry etch process using $CF_4$ and/or $CH_3F_4$ as an etchant.

Figure 16:
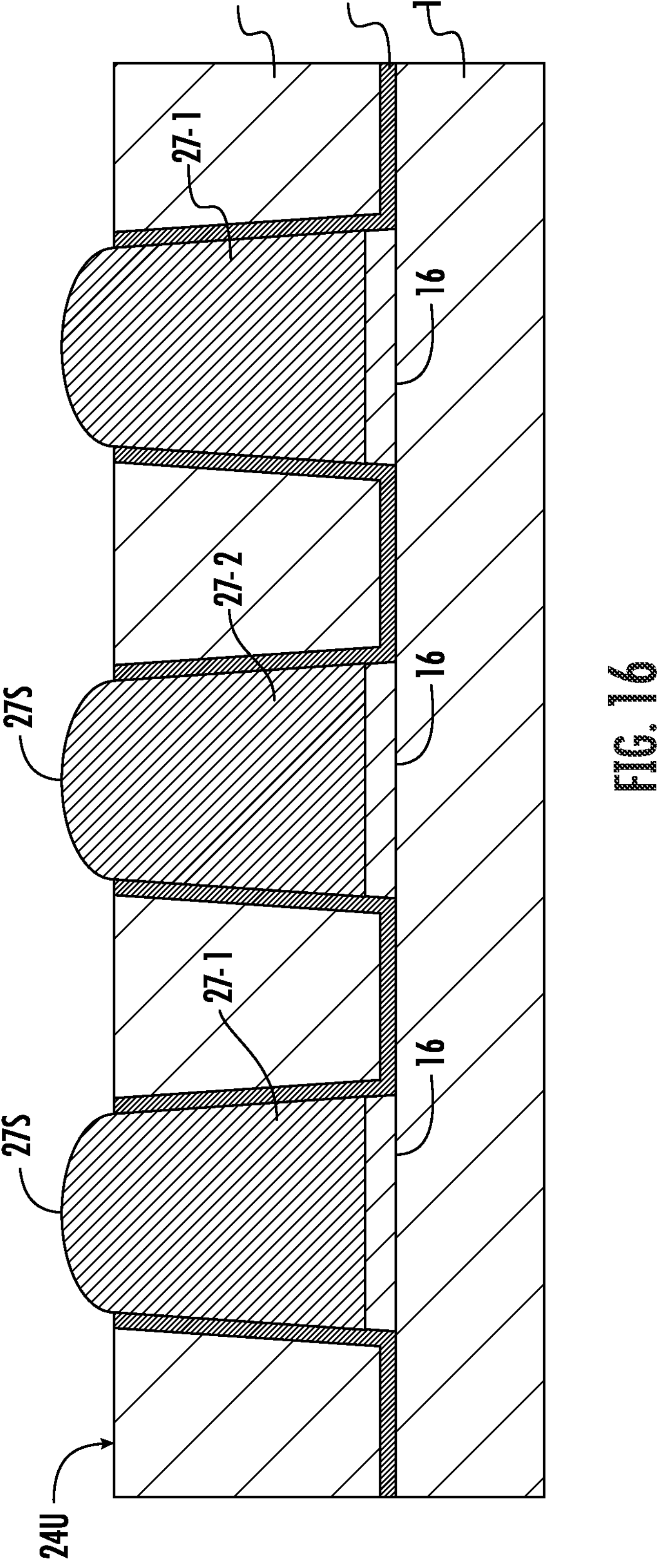

Referring to FIGS. 5 and 16, the upper portions of the preliminary first lower metal wire 27-1P and the preliminary second lower metal wire 27-2P may be rounded (Block 550) by etching, thereby forming first and second lower metal wires 27-1 and 27-2, each of which has a rounded upper surface 27S. The rounded upper surface 27S may have a convex shape. The upper portions of the preliminary first lower metal wire 27-1P and the preliminary second lower metal wire 27-2P may be etched by a dry etch process and/or a wet etch process, which selectively etch those upper portions while not etching the second insulating layer 24 and the additional adhesion layer 26.

Referring to FIGS. 5 and 12, the method may include forming an upper metal structure (Block 560). An etch stop layer (e.g., the etch stop layer 32' in FIG. 4A) may be formed on the first and second lower metal wires 27-1 and 27-2. Referring back to FIGS. 4A and 4B, the upper metal structure including a liner 36', a metal via 25' and an upper metal wire 37 may be formed by a dual damascene process (e.g., forming a third insulating layer 34 including an opening that includes a hole-shaped lower opening and a line-shaped upper opening and forming the liner 36', the metal via 25' and the upper metal wire 37 in the opening of the third insulating layer 34).

Figure 17:
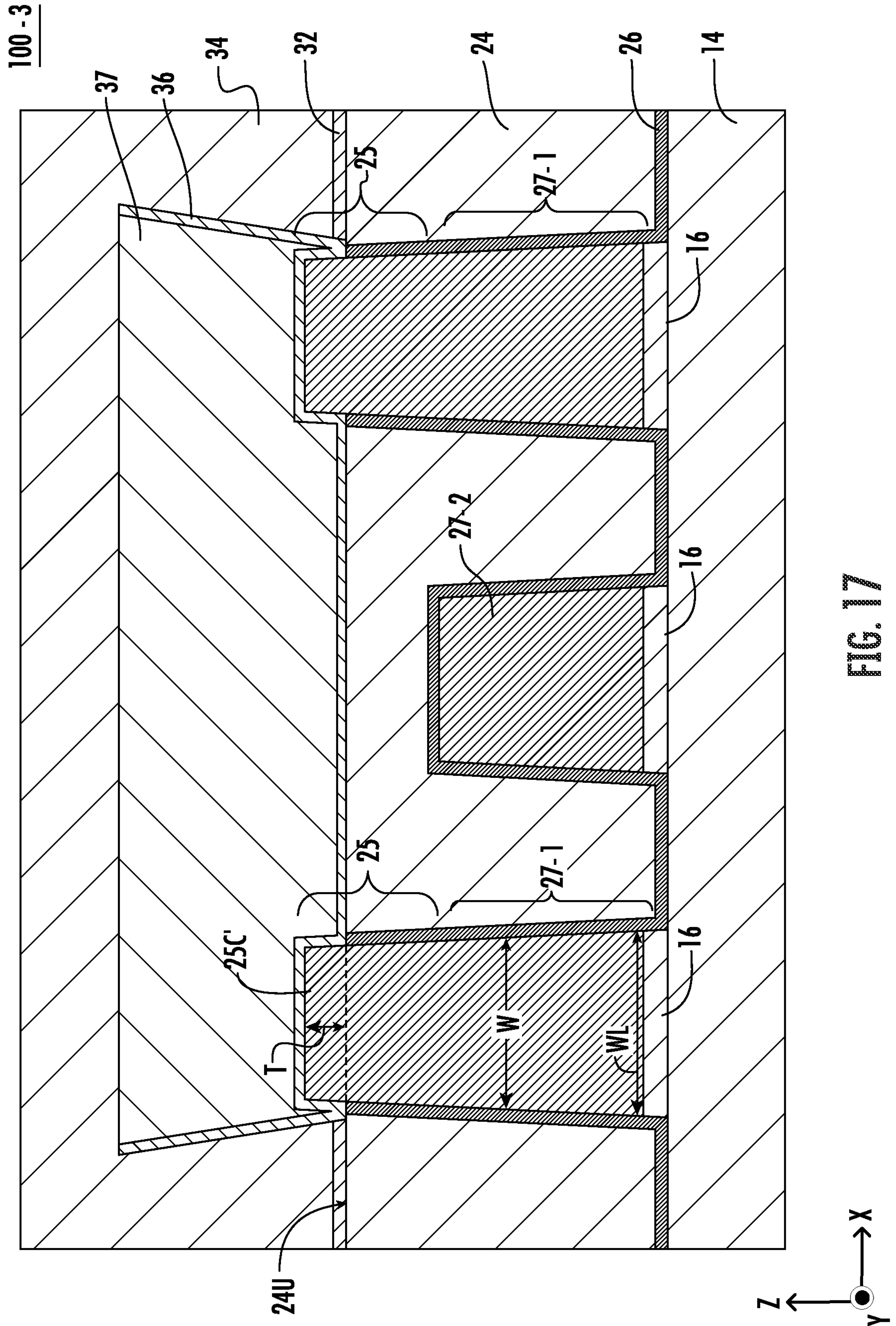
FIG. 17 is a cross-sectional view of an integrated circuit device taken along the line A-A in FIG. 2, according to some embodiments.

FIG. 17 is a cross-sectional view of a portion of a third integrated circuit device 100-3 taken along the line A-A in FIG. 2. The cross-sectional view in FIG. 17 is similar to the cross-sectional view in FIG. 3A with a primary difference being that a contact portion 25C' includes opposing upper corners and a side connecting those upper corners to each other. In some embodiments, the opposing upper corners may be sharp as illustrated in FIG. 17, but those upper corners may be round. The contact portion 25C' may have a generally trapezoidal shape, and upper corners may be sharp or round. The contact portion 25C' may protrude upwardly beyond an upper surface 24U of the second insulating layer 24. The third integrated circuit device 100-3 may be formed by performing processes similar to those described in FIG. 5 without the process described in Block 550 of FIG. 5. The third integrated circuit device 100-3 may be formed by performing processes described in Blocks 510 through 540 and 560 of FIG. 5. Specifically, after performing the processes described in Blocks 510 through 540 of FIG. 5, the process described in Block 550 of FIG. 5 may be omitted, and an etch stop layer (e.g., the etch stop layer 32 in FIG. 12) may be formed on the structure shown in FIG. 10.

The contact portion 27C of the second integrated circuit device 100-2 in FIGS. 4A and 4B may also have a shape similar to the contact portion 25C' in FIG. 17 and may be formed by performing processes similar to those described in FIG. 5 without the process described in Block 550 of FIG. 5.

Figure 18:
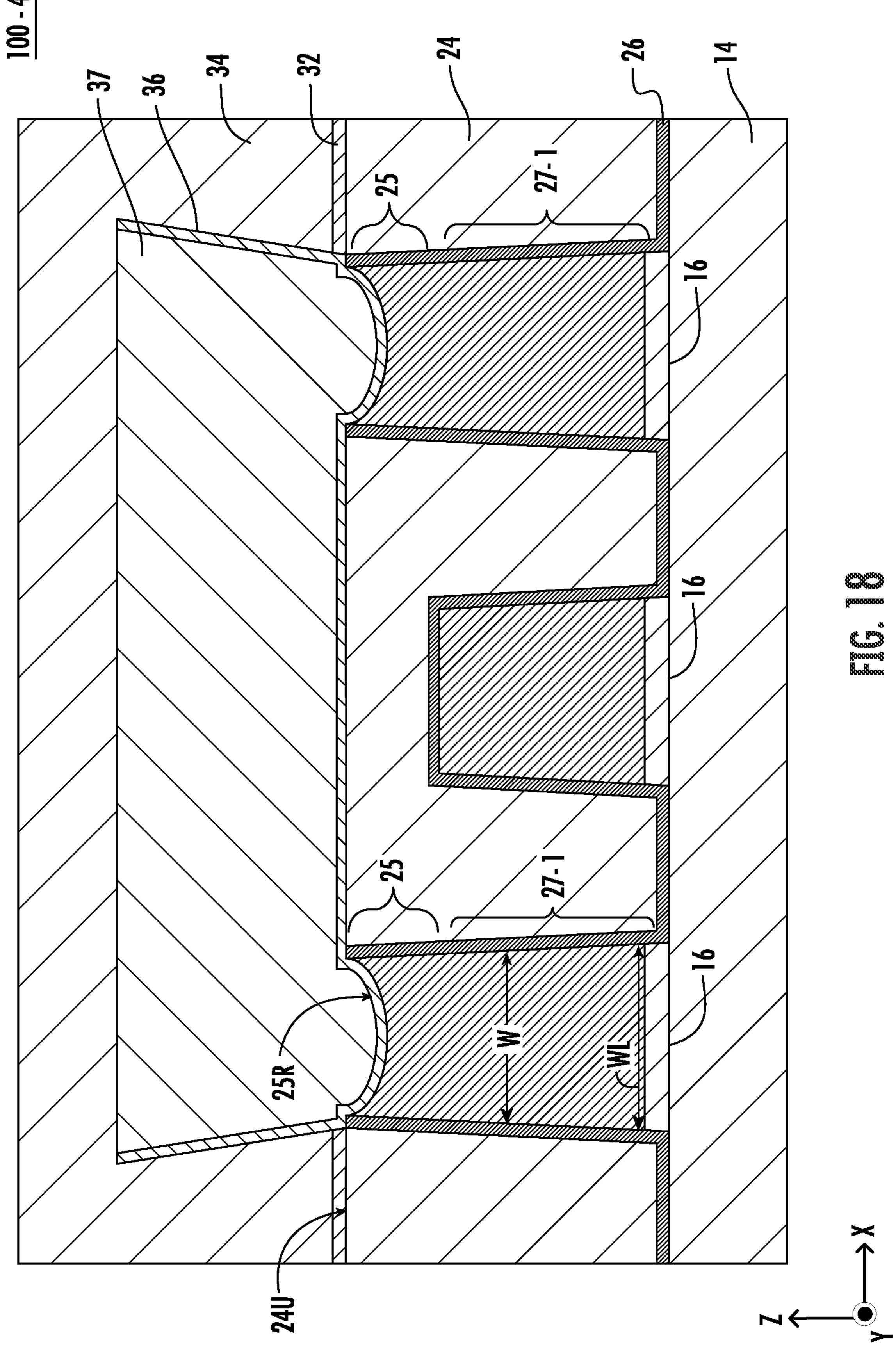
FIG. 18 is a cross-sectional view of an integrated circuit device taken along the line A-A in FIG. 2, according to some embodiments.

FIG. 18 is a cross-sectional view of a portion of a fourth integrated circuit device 100-4 taken along the line A-A in FIG. 2. The cross-sectional view in FIG. 18 is similar to the cross-sectional view in FIG. 3A with primary differences being that the metal via 25 (i.e., an upper portion of the first metal structure) includes an upper surface 25R recessed with respect to the upper surface 24U of the second insulating layer 24, and the liner 36 and the upper metal wire 37 may include portions that are provided in a recess defined by the recessed upper surface 25R of the metal via 25. The upper surface 25R may have a concave shape.

The first lower metal wire 27-1 of the second integrated circuit device 100-2 in FIGS. 4A and 4B may also include an upper surface that is recessed with respect to the upper surface 24U of the second insulating layer 24 and has a shape similar to the recessed upper surface 25R shown in FIG. 18. Portions of the liner 36' and metal via 25' may be provided in a recess defined by the recessed upper surface of the first lower metal wire 27-1.

Figure 19:
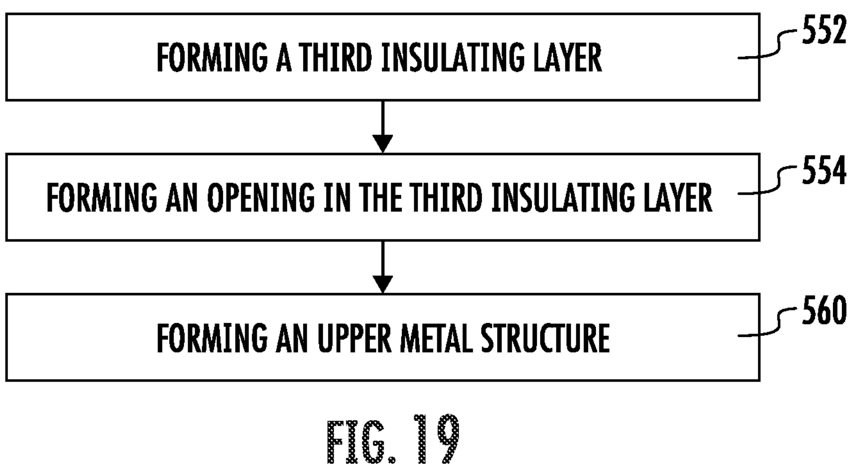
FIG. 19 is a flow chart of a method of forming an integrated circuit device according to some embodiments.
Figure 20:
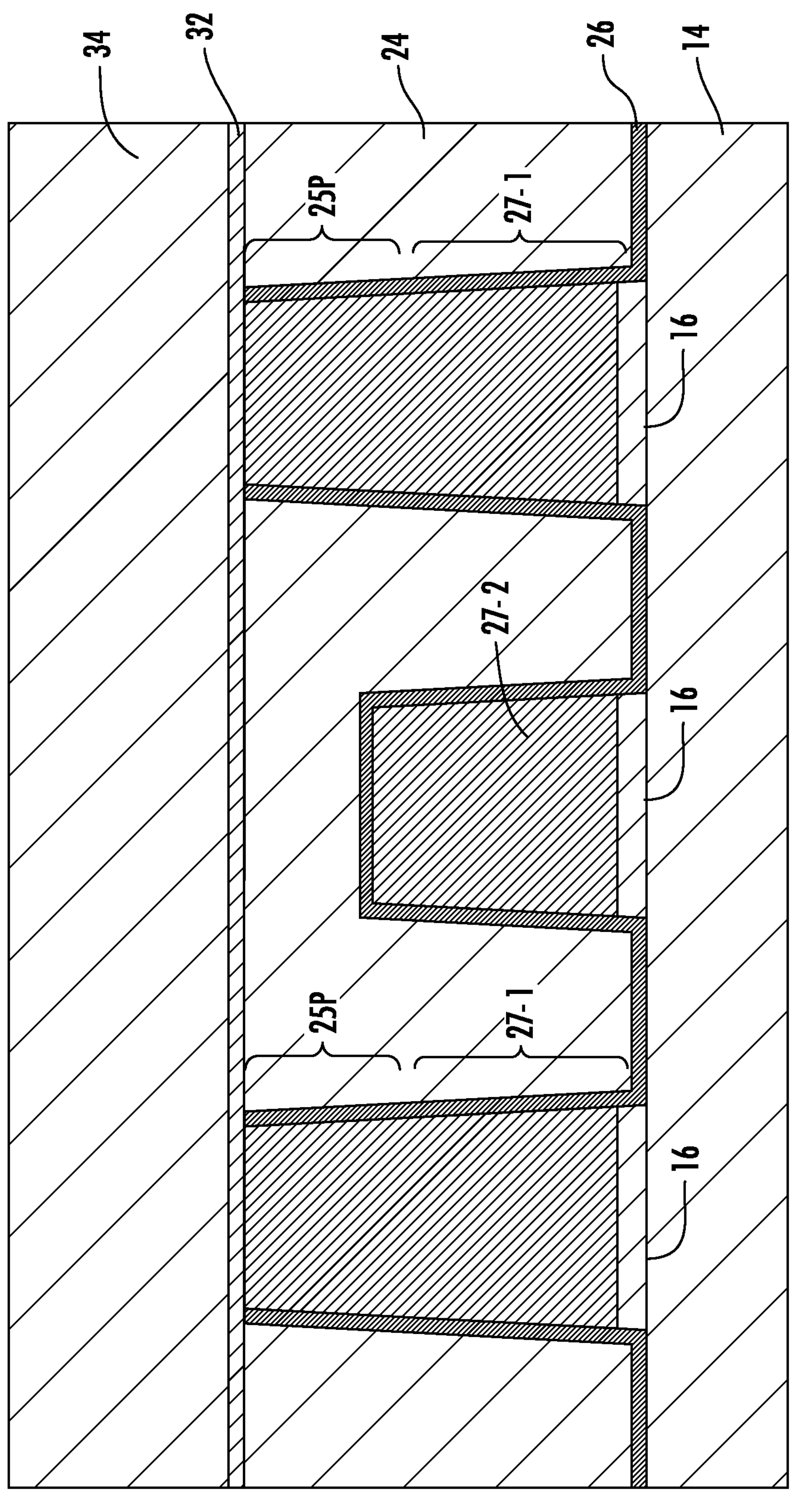
FIGS. 20 and 21 are cross-sectional views illustrating a method of forming an integrated circuit device according to some embodiments.
Figure 21:
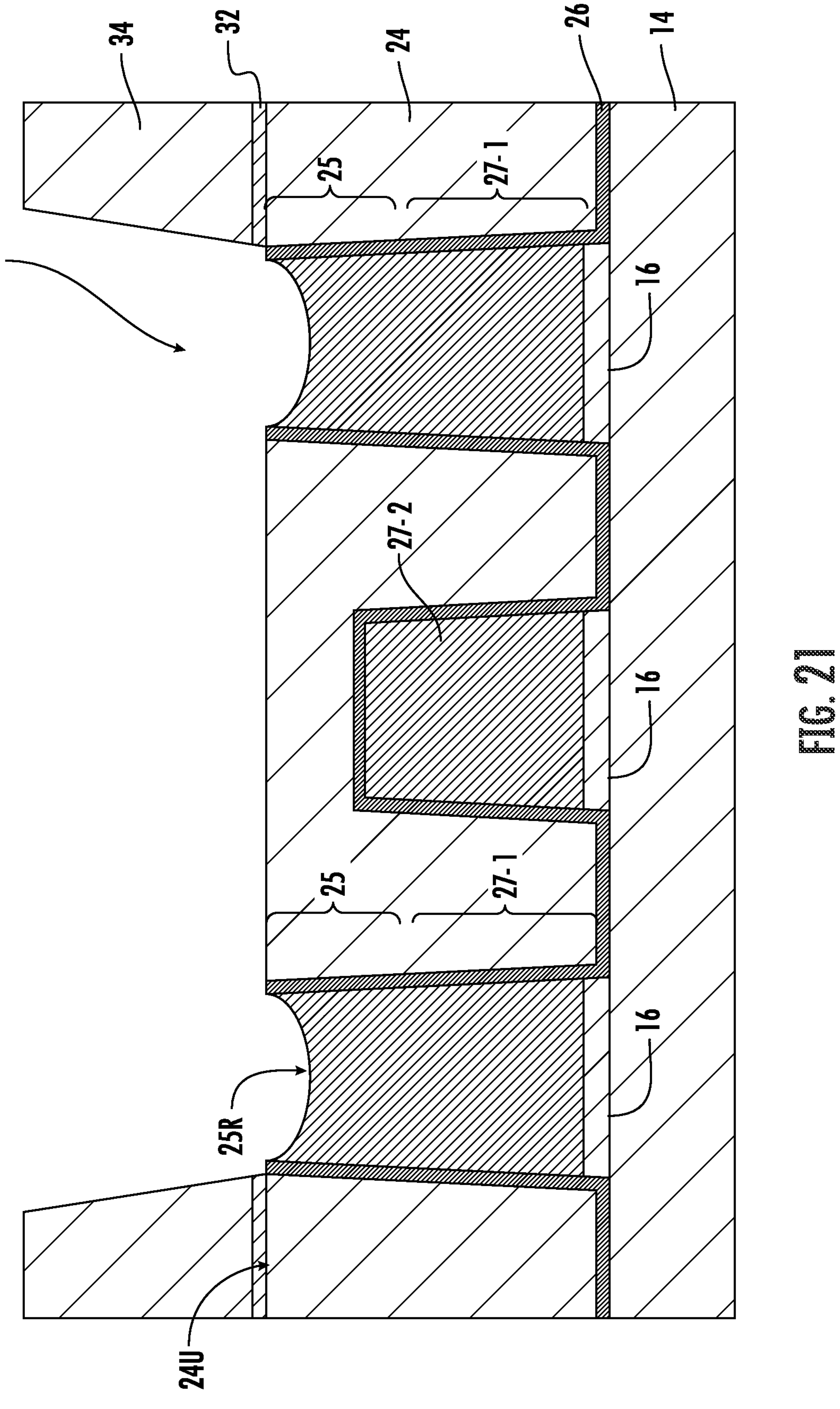

FIG. 19 is a flow chart of a method of forming the fourth integrated circuit device 100-4, and FIGS. 20 and 21 are cross-sectional views illustrating the method described in FIG. 19 according to some embodiments. Specifically, FIGS. 20 and 21 are cross-sectional views taken along the line A-A of FIG. 2. Processed shown in FIG. 19 may be performed after the processes described in Blocks 510 through 530 of FIG. 5 are performed. The process described in Block 540 may be omitted to form the fourth integrated circuit device 100-4, and thus the preliminary second insulating layer 24P (FIG. 9) can be referred to as a second insulating layer 24 (FIG. 11).

Referring to FIGS. 19 and 20, the method may include forming a third insulating layer 34 (Block 552) on a second insulating layer 24. An etch stop layer 32 may be formed on the second insulating layer 24 before forming the third insulating layer 34.

Referring to FIGS. 19 and 21, the method may include forming an opening 38 (Block 554). The opening may be formed by etching the third insulating layer 34 and the etch stop layer 32 until an upper surface of the preliminary metal via 25P is exposed and then performing over-etching to recess the upper surface of the preliminary metal via 25P. Etchant(s) and processes conditions of the over-etch process may be different from those of the etch process for the third insulating layer 34 and the etch stop layer 32 to selectively etch the preliminary metal via 25P.

Referring FIGS. 18 and 19, an upper metal structure including the liner 36 and the upper metal wire 37 may be formed (Block 560) in the opening 38 (FIG. 21).

Figure 22:
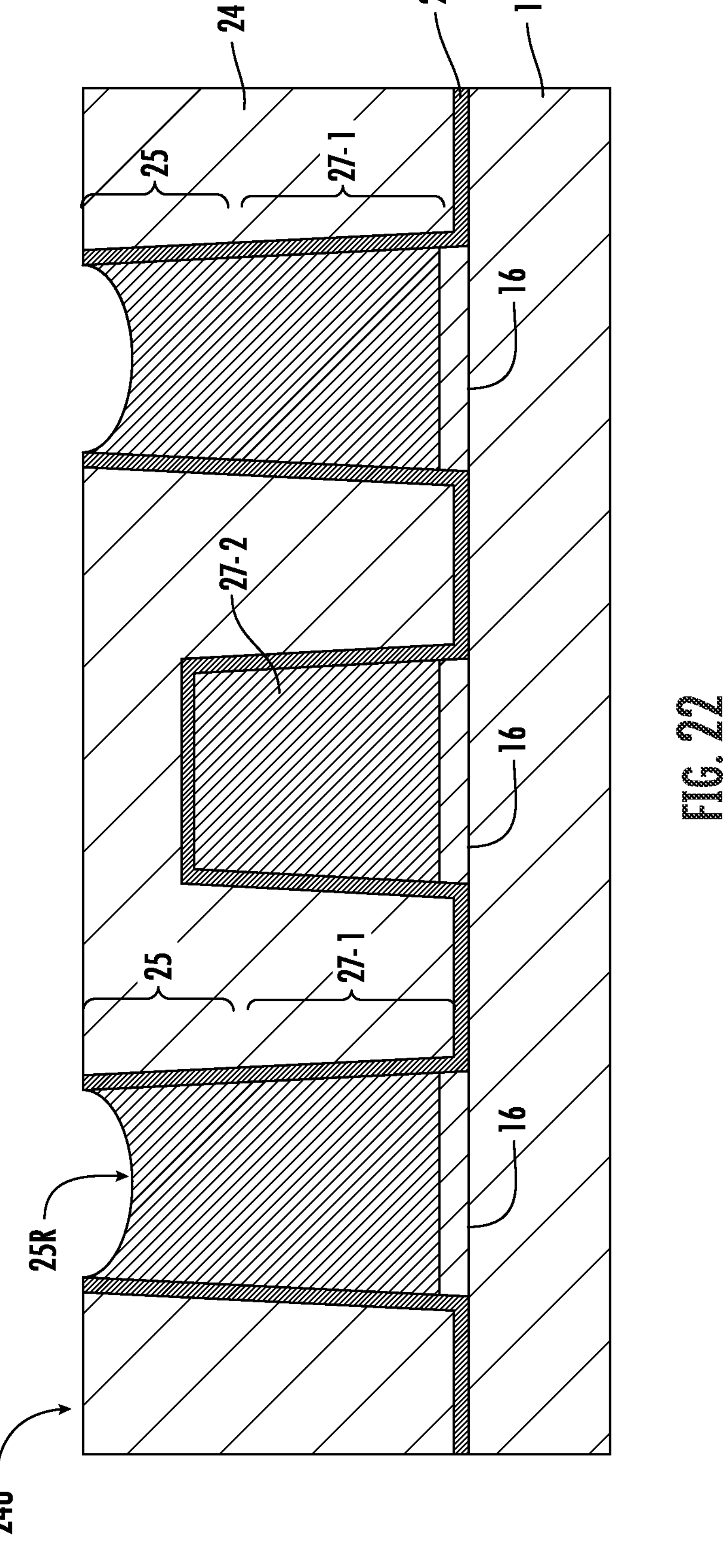
FIG. 22 is a cross-sectional view illustrating a method of forming an integrated circuit device according to some embodiments.

FIG. 22 is a cross-sectional view illustrating a method of forming the fourth integrated circuit device 100-4 according to some embodiments. Specifically, FIG. 22 is a cross-sectional view taken along the line A-A of FIG. 2.

Referring to FIG. 22, after performing the processes described in Blocks 510 through 530 of FIG. 5, the upper surface of the preliminary metal via 25P may be recessed to form an upper surface 25R recessed with respect to the upper surface 24U of the second insulating layer 24. The processes described in Blocks 540 and 550 of FIG. 5 may be omitted, and the process described in Block 560 of FIG. 5 may be performed on the structure shown in the FIG. 22.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:

providing an underlying structure including a substrate and a first insulating layer;

forming a first metal structure, a first adhesion pattern, and a second insulating layer on the first insulating layer, wherein the second insulating layer is on a side surface of the first metal structure, the first metal structure comprises a metal pattern and a second adhesion pattern that is between the first insulating layer and the metal pattern, and the first adhesion pattern contacts both a side surface of the metal pattern and a side surface of the second adhesion pattern; and forming a second metal structure on the first metal structure and the second insulating layer, wherein the metal pattern of the first metal structure comprises a contact portion that protrudes upwardly beyond an upper surface of the second insulating layer and contacts the second metal structure.

2. The method of claim 1, wherein forming the first metal structure, the first adhesion pattern and the second insulating layer comprises:

forming an adhesion layer on the first insulating layer;

forming a metal layer on the adhesion layer; and etching the metal layer and the adhesion layer, thereby forming a preliminary metal pattern and the second adhesion pattern.

3. The method of claim 2, wherein the metal layer comprises a ruthenium layer and/or a molybdenum layer.

4. The method of claim 2, wherein forming the first metal structure and the second insulating layer further comprises:

forming a preliminary second insulating layer on the preliminary metal pattern and the second adhesion pattern; and recessing the preliminary second insulating layer, thereby forming the second insulating layer, wherein an upper portion of the preliminary metal pattern protrudes upwardly beyond the upper surface of the second insulating layer.

5. The method of claim 4, wherein forming the first metal structure and the second insulating layer further comprises etching the upper portion of the preliminary metal pattern to form a rounded upper surface of the contact portion of the metal pattern.

6. The method of claim 1, wherein the contact portion of the metal pattern of the first metal structure comprises an upper surface that has a convex shape.

7. The method of claim 1, wherein the side surface of the metal pattern and the side surface of the second adhesion pattern form a straight side surface.

8. The method of claim 1, wherein the first adhesion pattern comprises an insulating layer, and the second adhesion pattern comprises a conductive layer.

9. The method of claim 1, wherein the contact portion of the metal pattern has a thickness from about 0.1 times to about 1.5 times a width of a lower surface of the metal pattern.

10. A method of forming an integrated circuit device, the method comprising:

providing an underlying structure including a substrate and a first insulating layer;

forming a first metal structure, a first adhesion pattern, and a second insulating layer on the first insulating layer, wherein the second insulating layer is on a side surface of the first metal structure, the first metal structure has a width decreasing as a distance from the first insulating layer increases, and the first metal structure comprises a metal pattern, a second adhesion pattern that is between the first insulating layer and the metal pattern, such that the first adhesion pattern contacts both a side surface of the metal pattern and a side surface of the second adhesion pattern; and forming a second metal structure on the first metal structure, wherein the metal pattern of the first metal structure comprises a contact portion that protrudes upwardly beyond an upper surface of the second insulating layer and contacts the second metal structure.

11. The method of claim 10, wherein the contact portion of the metal pattern of the first metal structure comprises an upper surface that has a convex shape.

12. The method of claim 10, wherein forming the first metal structure comprises:

forming an adhesion layer on the first insulating layer;

forming a metal layer on the adhesion layer; and etching the metal layer and the adhesion layer, thereby forming a preliminary metal pattern and the second adhesion pattern.

13. The method of claim 12, wherein forming the first metal structure further comprises:

forming a preliminary second insulating layer on the preliminary metal pattern and the second adhesion pattern; and recessing the preliminary second insulating layer, thereby forming the second insulating layer, wherein an upper portion of the preliminary metal pattern protrudes upwardly beyond the upper surface of the second insulating layer.

14. The method of claim 13, wherein forming the first metal structure further comprises etching the upper portion of the preliminary metal pattern to form a rounded upper surface of the contact portion of the metal pattern.

15. The method of claim 1, wherein the contact portion of the metal pattern of the first metal structure comprises an upper surface that comprises opposing upper corners.

16. The method of claim 10, wherein the contact portion of the metal pattern of the first metal structure comprises an upper surface that comprises opposing upper corners.

* * * * *